United States Patent
Song

(10) Patent No.: US 11,321,016 B2
(45) Date of Patent: May 3, 2022

(54) METHOD OF WRITING DATA IN MEMORY DEVICE, METHOD OF READING DATA FROM MEMORY DEVICE AND METHOD OF OPERATING MEMORY DEVICE INCLUDING THE SAME

(71) Applicant: SAMSUNG ELECTRONICS CO., LTD., Suwon-si (KR)

(72) Inventor: Youngsun Song, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 34 days.

(21) Appl. No.: 16/888,671

(22) Filed: May 30, 2020

(65) Prior Publication Data
US 2021/0181984 A1 Jun. 17, 2021

(30) Foreign Application Priority Data
Dec. 16, 2019 (KR) .................. 10-2019-0168037

(51) Int. Cl.
| | |
|---|---|
| G06F 3/06 | (2006.01) |
| G06F 11/10 | (2006.01) |
| G11C 16/26 | (2006.01) |
| G11C 16/04 | (2006.01) |
| G11C 16/10 | (2006.01) |

(52) U.S. Cl.
CPC .......... G06F 3/0659 (2013.01); G06F 3/0604 (2013.01); G06F 3/0679 (2013.01); G06F 11/1068 (2013.01); G11C 16/0483 (2013.01); G11C 16/10 (2013.01); G11C 16/26 (2013.01)

(58) Field of Classification Search
CPC .. G06F 3/0659; G06F 11/1068; G06F 3/0604; G06F 3/0679; G11C 16/0483; G11C 16/26; G11C 16/10
See application file for complete search history.

(56) References Cited

U.S. PATENT DOCUMENTS

| | | | |
|---|---|---|---|
| 6,212,117 B1* | 4/2001 | Shin | G11C 7/06 365/190 |
| 6,941,505 B2 | 9/2005 | Yada et al. | |
| 8,516,354 B2 | 8/2013 | Yang | |
| 9,564,930 B2 | 2/2017 | Suzuki et al. | |
| 2005/0281113 A1* | 12/2005 | Yada | G06F 11/1068 365/222 |

(Continued)

FOREIGN PATENT DOCUMENTS

| | | | |
|---|---|---|---|
| JP | 4897517 A | 1/2012 | |
| JP | 5542727 A | 11/2012 | |

(Continued)

*Primary Examiner* — Guy J Lamarre
(74) *Attorney, Agent, or Firm* — Volentine, Whitt & Francos, PLLC

(57) ABSTRACT

In a method of writing data in a memory device, a plurality of duplicated bit rows is generated by performing a first duplication operation in which a plurality of bits included in write data are copied by units of bits. A plurality of duplicated bit groups is generated by performing a second duplication operation in which the plurality of duplicated bit rows is copied by units of rows. The plurality of duplicated bit groups is stored into a plurality of memory regions included in the memory device, respectively. Each of the plurality of memory regions is a region that is simultaneously sensed during a data read operation.

23 Claims, 34 Drawing Sheets

(56) References Cited

U.S. PATENT DOCUMENTS

2006/0265636 A1* 11/2006 Hummler ............ G06F 11/1008
                                                    714/800
2018/0205396 A1*  7/2018 Ikegawa ............. G06F 11/1068
2019/0332313 A1* 10/2019 Xu ..................... G06F 3/0673
2019/0370167 A1* 12/2019 Widder .............. G06F 3/0659

FOREIGN PATENT DOCUMENTS

JP     20130025560 A    2/2018
KR     20020021001 A    3/2002

* cited by examiner

|      | BL1 | BL2 | BL3 | BL4 | BL5 | BL6 | BL7 | BL8 |
|------|-----|-----|-----|-----|-----|-----|-----|-----|
| DUP1 | 1   | 1   | 1   | 1   | 1   | 0   | 1   | 0   |
| DUP2 | 1   | 0   | 1   | 1   | 1   | 1   | 1   | 1   |
| DUP3 | 0   | 1   | 1   | 0   | 1   | 1   | 1   | 1   |
| DUP4 | 1   | 1   | 1   | 1   | 0   | 1   | 1   | 1   |
| SR   | 1   | 1   | 1   | 1   | 1   | 1   | 1   | 1   |

FIG. 33

$$MY = MW * MX = \begin{bmatrix} W11 & W12 & \cdots & W1r \\ W21 & W22 & \cdots & W2r \\ \vdots & & \ddots & \vdots \\ Wp1 & Wp2 & \cdots & Wpr \end{bmatrix} \begin{bmatrix} X11 & X12 & \cdots & X1q \\ X21 & X22 & \cdots & X2q \\ \vdots & & \ddots & \vdots \\ Xr1 & Xr2 & \cdots & Xrq \end{bmatrix} = \begin{bmatrix} Y11 & Y12 & \cdots & Y1q \\ Y21 & Y22 & \cdots & Y2q \\ \vdots & & \ddots & \vdots \\ Yp1 & Yp2 & \cdots & Ypq \end{bmatrix}$$

$$= \begin{bmatrix} W11X11+W12X21+ \cdots +W1rXr1 & \cdots & W11X1q+W12X2q+ \cdots & W1rXrq \\ W21X32+W22X21+ \cdots +W2rXr1 & \cdots & W21X1q+W22X2q+ \cdots & W2rXrq \\ \vdots & \ddots & & \vdots \\ Wp1X11+Wp2X21+ \cdots +WprXr1 & \cdots & Wp1X1q+Wp2X2q+ \cdots & WprXrq \end{bmatrix}$$

METHOD OF WRITING DATA IN MEMORY DEVICE, METHOD OF READING DATA FROM MEMORY DEVICE AND METHOD OF OPERATING MEMORY DEVICE INCLUDING THE SAME

CROSS-REFERENCE TO RELATED APPLICATION

This application claims priority under 35 USC § 119 to Korean Patent Application No. 10-2019-0168037, filed on Dec. 16, 2019 in the Korean Intellectual Property Office (KIPO), the contents of which are herein incorporated by reference in their entirety.

BACKGROUND

1. Technical Field

Example embodiments relate generally to semiconductor integrated circuits and more particularly to methods of writing data in memory devices, methods of reading data from memory devices, and methods of operating memory devices including the methods of writing and reading data.

2. Description of the Related Art

Semiconductor memory devices can be generally divided into two categories depending upon whether they retain stored data when disconnected from power. These categories include volatile memory devices, which lose stored data when disconnected from power, and nonvolatile memory devices, which retain stored data when disconnected from power. Data write and/or read operations of the volatile memory devices may be different from data write and/or read operations of the nonvolatile memory devices.

Recently, an error correction code (ECC) encoding and/or decoding are performed in both the volatile memory device and the nonvolatile memory device to ensure or guarantee the data integrity. However, the time required for data write and/or read operations may increase due to the ECC encoding and/or decoding and the burden of data input/output (I/O), the decrease in performance efficiency, and the increase in cost may occur when using the ECC process located outside the memory device (e.g., usually located in a memory controller).

SUMMARY

At least one example embodiment of the present disclosure provides a method of writing data in a memory device and a method of reading data from a memory device capable of ensuring the data integrity without reducing the response speed or cost.

At least one example embodiment of the present disclosure provides a method of operating a memory device that includes the method of writing data and the method of reading data.

According to example embodiments, in a method of writing data in a memory device, a plurality of duplicated bit rows is generated by performing a first duplication operation in which a plurality of bits included in write data are copied by units of bits. A plurality of duplicated bit groups is generated by performing a second duplication operation in which the plurality of duplicated bit rows is copied by units of rows. The plurality of duplicated bit groups is stored into a plurality of memory regions included in the memory device, respectively. Each of the plurality of memory regions is a region that is simultaneously sensed during a data read operation.

According to example embodiments, in a method of reading data from a memory device, when read data including a plurality of bits is written in a scheme such that the plurality of bits is copied by units of bits to generate a plurality of duplicated bit rows, the plurality of duplicated bit rows is copied by units of rows to generate a plurality of duplicated bit groups, and the plurality of duplicated bit groups is stored into a plurality of memory regions included in the memory device, respectively, each of the plurality of duplicated bit groups is simultaneously sensed. The plurality of duplicated bit rows is obtained by performing a first error correction based on a majority sensing on a sensing result of the plurality of duplicated bit groups.

According to example embodiments, in a method of operating a memory device, a data write operation in which first data is double-duplicated and double-duplicated first data is stored is performed. A data read operation in which the double-duplicated first data is retrieved is performed. When performing the data write operation, a first duplicated bit row is generated by performing a first duplication operation in which a first bit included in the first data is copied by units of bits. A first duplicated bit group is generated by performing a second duplication operation in which the first duplicated bit row is copied by units of rows. The first duplicated bit group is stored into a first memory region. The first memory region is connected to a same bitline and is a region that is simultaneously sensed during the data read operation. When performing the data read operation, the first duplicated bit group is simultaneously sensed. The first duplicated bit row is obtained by performing a first error correction based on a majority sensing on a sensing result of the first duplicated bit group. When obtaining the first duplicated bit row, when a first sensing voltage is higher than a first reference voltage, one bit of the first duplicated bit row is obtained as a first value. The first sensing voltage is obtained by simultaneously sensing memory cells that are connected to a first bitline and storing the first bit among memory cells included in the first memory region. When the first sensing voltage is lower than or equal to the first reference voltage, the one bit of the first duplicated bit row is obtained as a second value.

In the method of writing data in the memory device, the method of reading data from the memory device, and the method of operating the memory device according to example embodiments, data may be written by performing the double-duplication operation, and the data may be read based on the multi-step error correction that performs the majority sensing and/or additionally performs the majority voting. Accordingly, the data integrity may be ensured or guaranteed without the external ECC, e.g., without decreasing the response speed and increasing the cost.

BRIEF DESCRIPTION OF THE DRAWINGS

Illustrative, non-limiting example embodiments will be more clearly understood from the following detailed description taken in conjunction with the accompanying drawings.

FIGS. 32, 33 and 34 are diagrams for describing a matrix multiplication method using a memory device according to example embodiments.

DETAILED DESCRIPTION OF THE EMBODIMENTS

Figure 1:
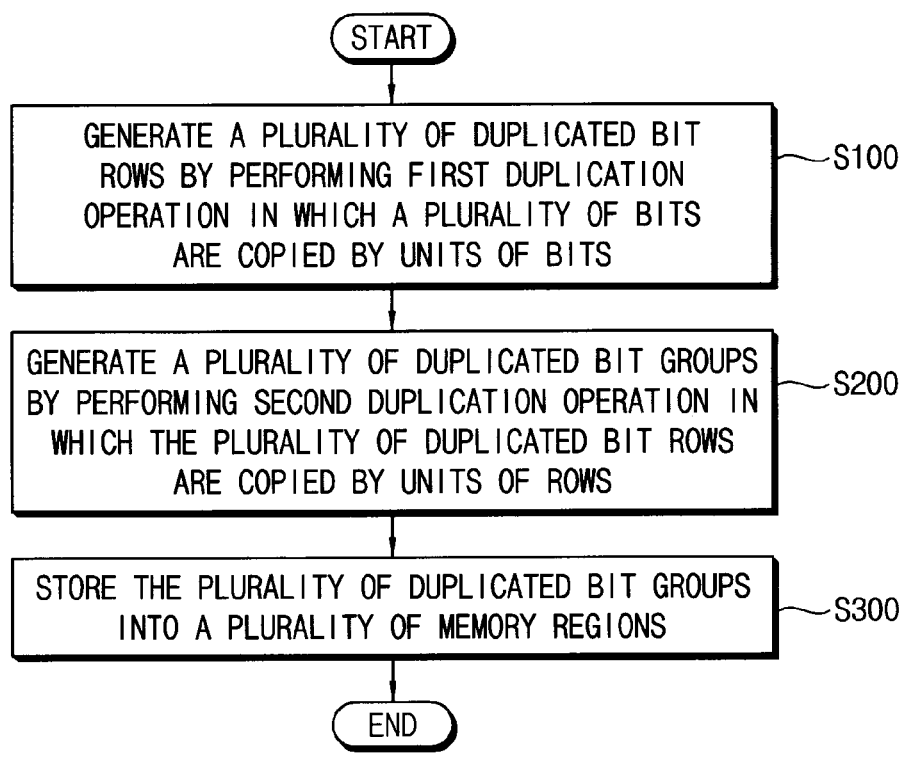
FIG. 1 is a flowchart illustrating a method of writing data in a memory device according to example embodiments.

Various example embodiments will be described more fully with reference to the accompanying drawings, in which embodiments are shown. The present disclosure may, however, be embodied in many different forms and should not be construed as limited to the embodiments set forth herein. Like reference numerals refer to like elements throughout this application.

FIG. 1 is a flowchart illustrating a method of writing data in a memory device according to example embodiments.

Referring to FIG. 1, a memory device performing a method of writing data according to example embodiments may include a memory cell array that stores data and a data duplication and arrangement circuit that copies (e.g., duplicates or replicates) and rearranges write data to be stored. Configurations of the memory device and a memory system including the memory device will be described with reference to FIGS. 2 and 3.

In the method of writing data in the memory device according to example embodiments, a plurality of duplicated bit rows are generated by performing a first duplication (or replication) operation in which a plurality of bits included in the write data are copied by units of bits (e.g., in bit units, bit by bit, or a bit-by-bit basis) (step S100). The write data may be provided together with a write command and a write address. A plurality of duplicated bit groups is generated by performing a second duplication operation in which the plurality of duplicated bit rows is copied by units of rows (e.g., in row units, row by row, or a row-by-row basis) (step S200). The plurality of duplicated bit groups is stored into a plurality of memory regions included in the memory device, respectively (step S300). Each of the plurality of memory regions is a region that is substantially simultaneously or concurrently sensed during a data read operation.

In the method of writing data in the memory device according to example embodiments, the first duplication operation for copying the write data by units of bits may be performed, the second duplication operation for copying a result of the first duplication operation by units of rows may be performed, and then the plurality of duplicated bit groups may be finally stored. By performing the above-described double-duplication operation, the data integrity may be ensured or guaranteed by applying an error correction scheme of a majority sensing and/or a majority voting in a subsequent data read operation, without an external error correction code (ECC) (or by minimizing a use of the external ECC). Accordingly, the response speed may be improved or enhanced, and processing-in-memory (PIM) or computing-in-memory (CIM) may be efficiently performed.

Figure 2:
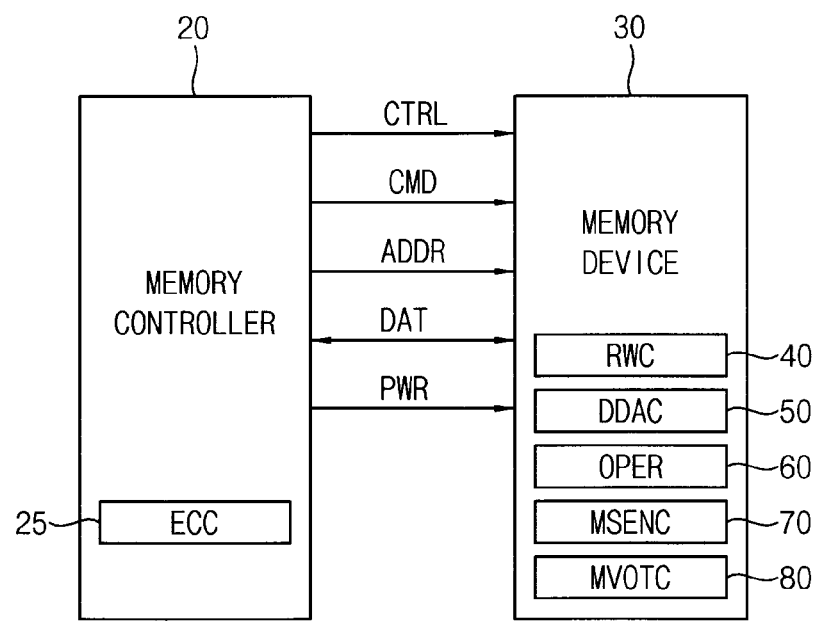
FIG. 2 is a block diagram illustrating a memory system including a memory device according to example embodiments.

FIG. 2 is a block diagram illustrating a memory system including a memory device according to example embodiments.

Referring to FIG. 2, a memory system 10 may include a memory controller 20 and at least one memory device 30.

In some example embodiments, as will be described with reference to FIG. 3, the memory device 30 may be a nonvolatile memory device and the memory system 10 may include data storage medium based on flash memory such as a memory card, a solid state drive (SSD), and the like. In other example embodiments, the memory device 30 may be a volatile memory device.

The memory device 30 may perform a read operation, an erase operation, a program operation, and/or a write operation under control of the memory controller 20. The memory device 30 may receive a command CMD, an address ADDR and data DAT through input/output lines from the memory controller 20 for performing such operations. In addition, the memory device 30 may receive a control signal CTRL through a control line from the memory controller 20. In addition, the memory device 30 may receive power PWR through a power line from the memory controller 20.

The memory controller 20 may include an ECC block 25. The ECC block 25 for error correction may perform coded modulation using a Bose-Chaudhuri-Hocquenghem (BCH) code, a low density parity check (LDPC) code, a turbo code, a Reed-Solomon code, a convolution code, a recursive systematic code (RSC), a trellis-coded modulation (TCM), a block coded modulation (BCM), etc., or may perform ECC encoding and ECC decoding using the above-described codes or other error correction codes. In some example embodiments, the ECC encoding and/or decoding may not be performed, such as the method of writing data of FIG. 1, a method of reading data of FIG. 13, and the like. In other example embodiments, the ECC encoding and/or decoding may be selectively performed, such as a method of writing data of FIG. 10, a method of reading data of FIG. 20, and the like.

The memory device 30 may include a data duplication and arrangement circuit (DDAC) 50 for performing the above-described method of data writing and may include a majority sensing circuit (MSENC) 70 and a majority voting circuit (MVOTC) 80 for performing a method of reading data which will be described later. In addition, the memory device 30 may further include a read-write circuit (RWC) 40 and an operation (or calculation) circuit (OPER) 60 for performing a matrix multiplication method which will be described later.

Figure 3:
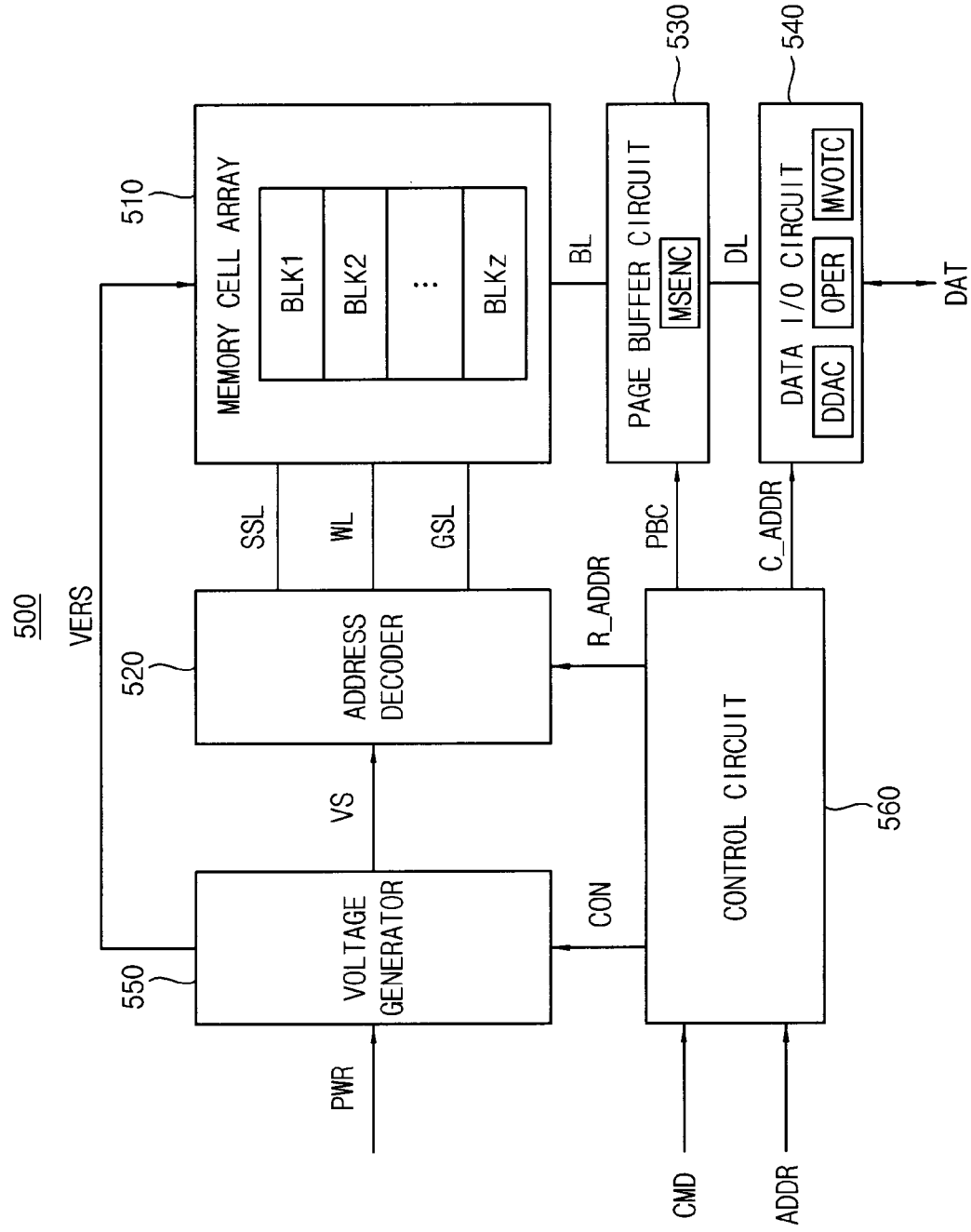
FIG. 3 is a block diagram illustrating a memory device according to example embodiments.

FIG. 3 is a block diagram illustrating a memory device according to example embodiments.

Referring to FIG. 3, a memory device 500 includes a memory cell array 510, an address decoder 520, a page buffer circuit 530, a data input/output (I/O) circuit 540, a voltage generator 550 and a control circuit 560. In FIG. 3 and subsequent figures, the memory device will be described based on an example of a nonvolatile memory device.

The memory cell array 510 is connected to the address decoder 520 via a plurality of string selection lines SSL, a plurality of wordlines WL and a plurality of ground selection lines GSL. The memory cell array 510 is further connected to the page buffer circuit 530 via a plurality of bitlines BL. The memory cell array 510 may include a plurality of memory cells (e.g., a plurality of nonvolatile memory cells) that are connected to the plurality of wordlines WL and the plurality of bitlines BL. The memory cell array 510 may be divided into a plurality of memory blocks BLK1, BLK2, . . . , BLKz each of which includes memory cells. In addition, each of the plurality of memory blocks BLK1, BLK2, . . . , BLKz may be divided into a plurality of pages. As will be described with reference to FIGS. 4A and 4B, the plurality of memory cells in the memory cell array 510 may be arranged in a two-dimensional (2D) array structure or a three-dimensional (3D) vertical array structure.

The control circuit 560 receives a command CMD and an address ADDR from the outside (e.g., the memory controller 20 in FIG. 2), and controls operations (e.g., erasure, programming and read operations) of the memory device 500 based on the command CMD and the address ADDR. For example, the control circuit 560 may generate control signals CON, which are used for controlling the voltage generator 550, and may generate control signal PBC for controlling the page buffer circuit 530, based on the command CMD, and may generate a row address R_ADDR and a column address C_ADDR based on the address ADDR. The control circuit 560 may provide the row address R_ADDR to the address decoder 520 and may provide the column address C_ADDR to the data I/O circuit 540.

The address decoder 520 may be connected to the memory cell array 510 via the plurality of string selection lines SSL, the plurality of wordlines WL and the plurality of ground selection lines GSL.

The voltage generator 550 may generate voltages VS that are required for the operations of the memory device 500 based on power PWR and the control signals CON. The voltages VS may be applied to the plurality of string selection lines SSL, the plurality of wordlines WL and the plurality of ground selection lines GSL via the address decoder 520. In addition, the voltage generator 550 may generate an erase voltage VERS that is required for the data erase operation based on the power PWR and the control signals CON. The erase voltage VERS may be applied to the memory cell array 510 directly or via the bitline BL.

The page buffer circuit 530 may be connected to the memory cell array 510 via the plurality of bitlines BL. The page buffer circuit 530 may include a plurality of page buffers. The page buffer circuit 530 may store data DAT to be programmed into the memory cell array 510 or may read data DAT sensed from the memory cell array 510.

The data I/O circuit 540 may be connected to the page buffer circuit 530 via data lines DL. The data I/O circuit 540 may provide the data DAT from an outside of the memory device 500 to the memory cell array 510 via the page buffer circuit 530 or may provide the data DAT from the memory cell array 510 to the outside of the memory device 500 via the page buffer circuit 530, based on the column address C_ADDR.

A data duplication and arrangement circuit DDAC, a majority sensing circuit MSENC, a majority voting circuit MVOTC and an operation circuit OPER in FIG. 3 may correspond to the data duplication and arrangement circuit 50, the majority sensing circuit 70, the majority voting circuit 80 and the operation circuit 60 in FIG. 2, respectively, and the page buffer circuit 530 in FIG. 3 may correspond to the read-write circuit 40 in FIG. 2. In some example embodiments, as illustrated in FIG. 3, the majority sensing circuit MSENC, the data duplication and arrangement circuit DDAC, the majority voting circuit MVOTC and the operation circuit OPER may be included in the page buffer circuit 530 and the data I/O circuit 540. In other example embodiments, although not illustrated in FIG. 3, at least one of the majority sensing circuit MSENC, the data duplication and arrangement circuit DDAC, the majority voting circuit MVOTC and the operation circuit OPER may be implemented as a component (or element) that is separate, distinguished or distinct from the page buffer circuit 530 and the data I/O circuit 540.

Figure 4A:
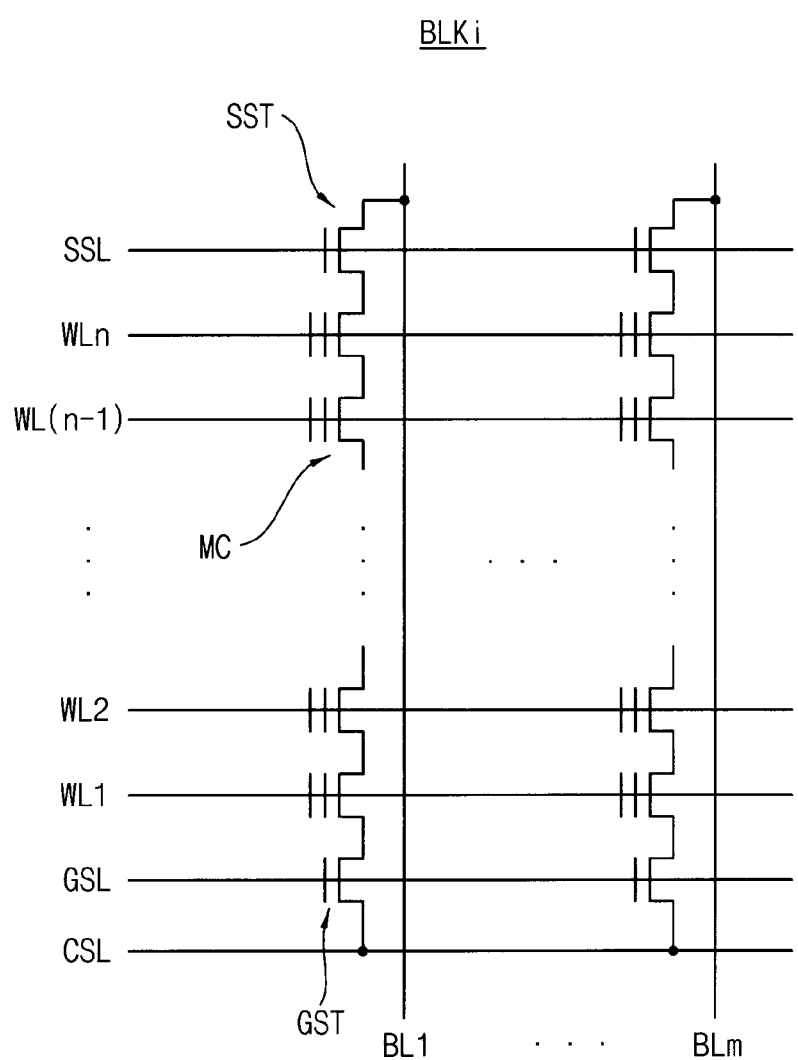
FIGS. 4A and 4B are diagrams illustrating examples of a memory block included in a memory cell array in a memory device of FIG. 3.
Figure 4B:
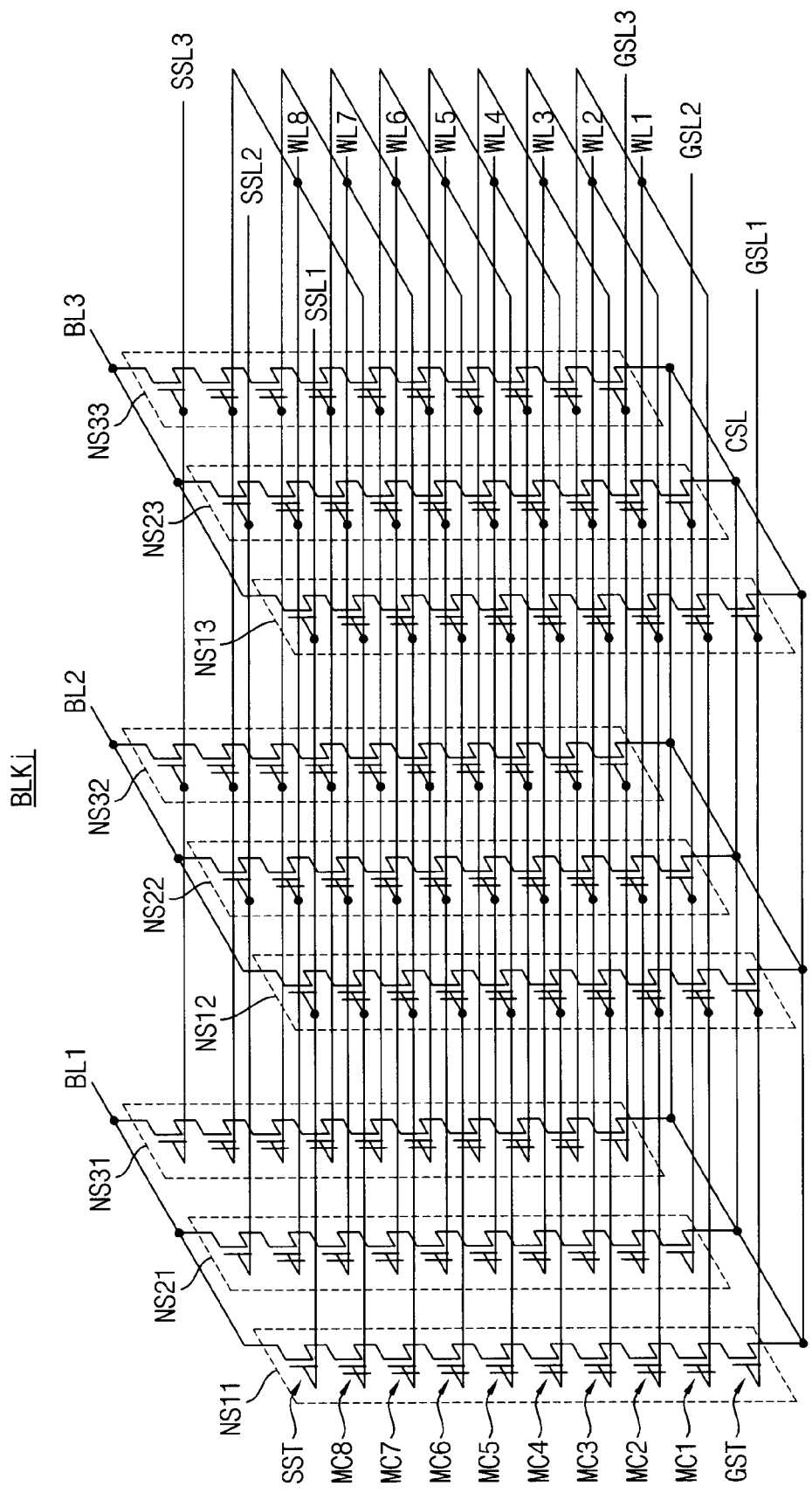

FIGS. 4A and 4B are diagrams illustrating examples of a memory block included in a memory cell array in a memory device of FIG. 3. FIG. 4A is a circuit diagram illustrating an example of a memory block included in a NAND flash memory device. FIG. 4B is a circuit diagram illustrating an example of a memory block included in a vertical NAND flash memory device.

Referring to FIG. 4A, a memory block BLKi may include string selection transistors SST, ground selection transistors GST, and memory cells MC. The string selection transistors SST may be connected to bitlines BL1, . . . , BLm, and the ground selection transistors GST may be connected to a common source line CSL. The memory cells arranged in the same row may be disposed in series between one of the bitlines BL1 to BLm and the common source line CSL, and the memory cells arranged in the same column may be connected in common to one of wordlines WL1, WL2, . . . , WL(n−1), WLn.

The string selection transistors SST may be connected to the string selection line SSL such that the string selection transistors SST are controlled according to a level of a voltage applied from the string selection line SSL. The ground selection transistors GST may be connected to the ground selection line GSL such that the ground selection transistors GST are controlled according to a level of a voltage applied from the ground selection line GSL. The memory cells MC may be controlled according to levels of voltages applied to the wordlines WL1 to WLn.

A memory block BLKj of FIG. 4B may be a three-dimensional memory block, which is formed on a substrate in a three-dimensional structure (or a vertical structure). For example, the memory block BLKj may include a plurality of vertical cell strings (e.g., NAND strings) that are vertically oriented such that at least one memory cell is located over another memory cell. The plurality of vertical cell strings included in the memory block BLKj may be formed in a direction perpendicular to the substrate.

Referring to FIG. 4B, the memory block BLKj may include a plurality of NAND strings NS11, NS12, NS13, NS21, NS22, NS23, NS31, NS32 and NS33 connected between bitlines BL1, BL2 and BL3 and a common source line CSL. Each of the NAND strings NS11 to NS33 may include a string selection transistor SST, a plurality of memory cells MC1, MC2, MC3, MC4, MC5, MC6, MC7 and MC8, and a ground selection transistor GST.

Each string selection transistor SST may be connected to a corresponding string selection line (one of SSL1, SSL2 and SSL3). The plurality of memory cells MC1 to MC8 may be connected to corresponding wordlines WL1, WL2, WL3, WL4, WL5, WL6, WL7 and WL8, respectively. Each ground selection transistor GST may be connected to a corresponding ground selection line (one of GSL1, GSL2 and GSL3). Each string selection transistor SST may be connected to a corresponding bitline (e.g., one of BL1 to BL3), and each ground selection transistor GST may be connected to the common source line CSL.

NAND strings connected in common to one bitline may form one column, and NAND strings connected to one string selection line may form one row. For example, the NAND strings NS11, NS21 and NS31 connected to the first bitline BL1 may correspond to a first column and the NAND strings NS11, NS12 and NS13 connected to the first string selection line SSL1 may form a first row.

A three-dimensional vertical array structure may include vertical NAND strings that are vertically oriented such that at least one memory cell is located over another memory cell. The at least one memory cell may comprise a charge trap layer. The following patent documents, which are hereby incorporated by reference in their entirety, describe suitable configurations for a memory cell array including a 3D vertical array structure, in which the three-dimensional memory array is configured as a plurality of levels, with wordlines and/or bitlines shared between levels: U.S. Pat. Nos. 7,679,133; 8,553,466; 8,654,587; 8,559,235; and US Pat. Pub. No. 2011/0233648.

Although the memory cell array and the memory block included in the memory device according to example embodiments are described based on a NAND flash memory device, the memory device according to example embodiments may be any nonvolatile memory device, e.g., a phase random access memory (PRAM), a resistive random access memory (RRAM), a nano floating gate memory (NFGM), a polymer random access memory (PoRAM), a magnetic random access memory (MRAM), a ferroelectric random access memory (FRAM), a thyristor random access memory (TRAM), etc., or any volatile memory device, e.g., a dynamic random access memory (DRAM), a static random access memory (SRAM), etc.

Figure 5:
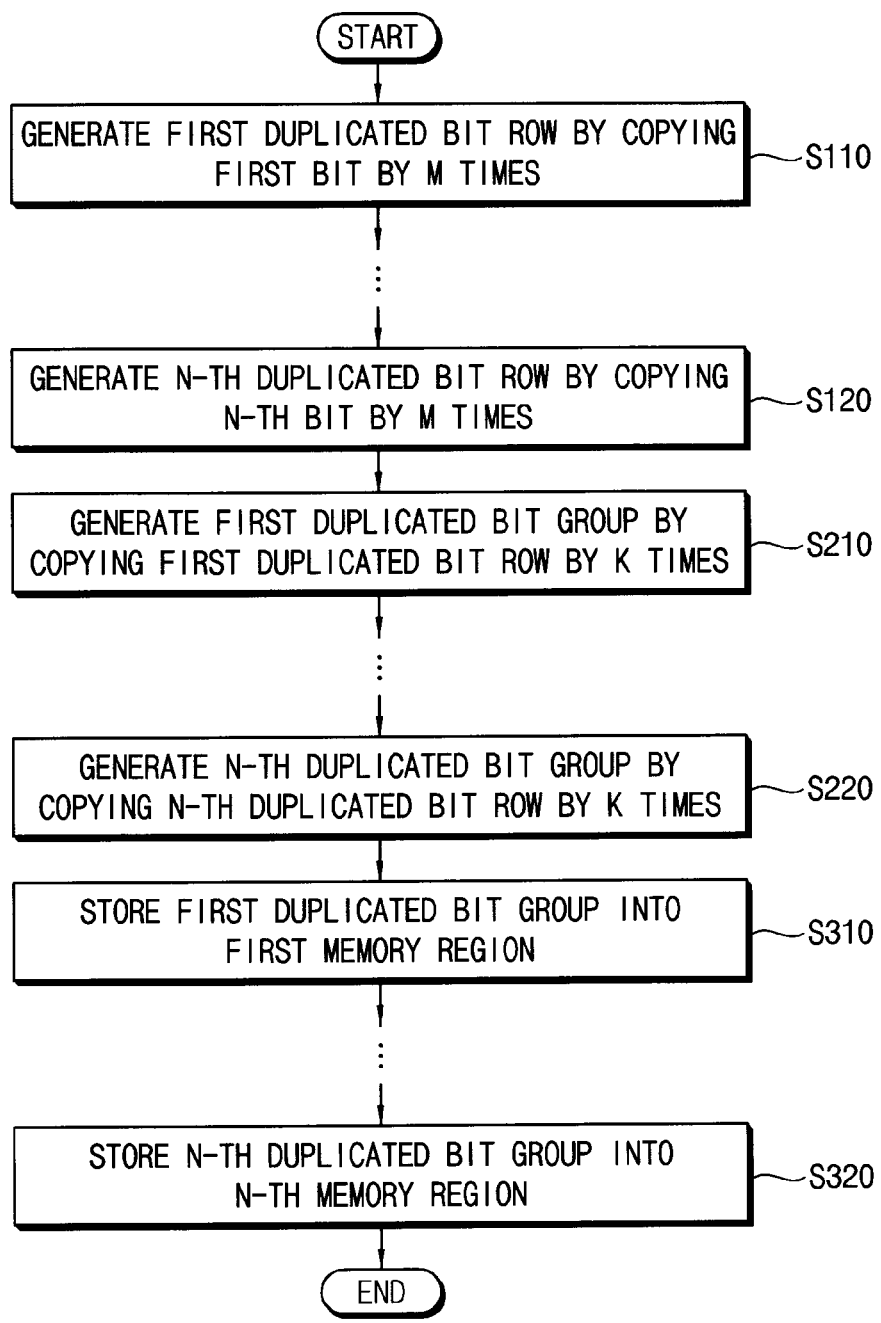
FIG. 5 is a flowchart illustrating a detailed example of a method of writing data in a memory device of FIG. 1.

FIG. 5 is a flowchart illustrating a detailed example of a method of writing data in a memory device of FIG. 1. FIGS. 6A, 6B, 7A, 7B, 8A and 8B are diagrams for describing an operation of writing data of FIG. 5.

Referring to FIGS. 1 and 5, the write data stored in the memory device by the method of writing data according to example embodiments may include first through n-th bits, where n is a natural number greater than or equal to two. Each of the first through n-th bits may be copied m times by the first duplication operation to generate a respective one of first through n-th duplicated bit rows, where m is a natural number greater than or equal to two. Each of the first through n-th duplicated bit rows may be copied k times by the second duplication operation to generate a respective one of first through n-th duplicated bit groups, where k is a natural number greater than or equal to two. Each of the first through n-th duplicated bit groups may be stored into a respective one of first through n-th memory regions included in the memory device.

For example, when generating the plurality of duplicated bit rows by performing the first duplication operation (step S100), the first duplicated bit row may be generated by copying the first bit m times (step S110) and the n-th duplicated bit row may be generated by copying the n-th bit m times (step S120).

When generating the plurality of duplicated bit groups by performing the second duplication operation (step S200), the first duplicated bit group may be generated by copying the first duplicated bit row k times (step S210) and the n-th duplicated bit group may be generated by copying the n-th duplicated bit row k times (step S220).

When storing the plurality of duplicated bit groups into the plurality of memory regions, respectively (step S300), the first duplicated bit group may be stored into the first memory region (step S310) and the n-th duplicated bit group may be stored into the n-th memory region (step S320). Thus, each of the plurality of bits included in the write data may be double-duplicated (or double-copied) m*k times and each double-duplicated bit may be stored in the memory device.

In some example embodiments, as will be described with reference to FIG. 9, an order of the first duplication operation, the second duplication operation and the storage operation may be changed.

Figure 6A:
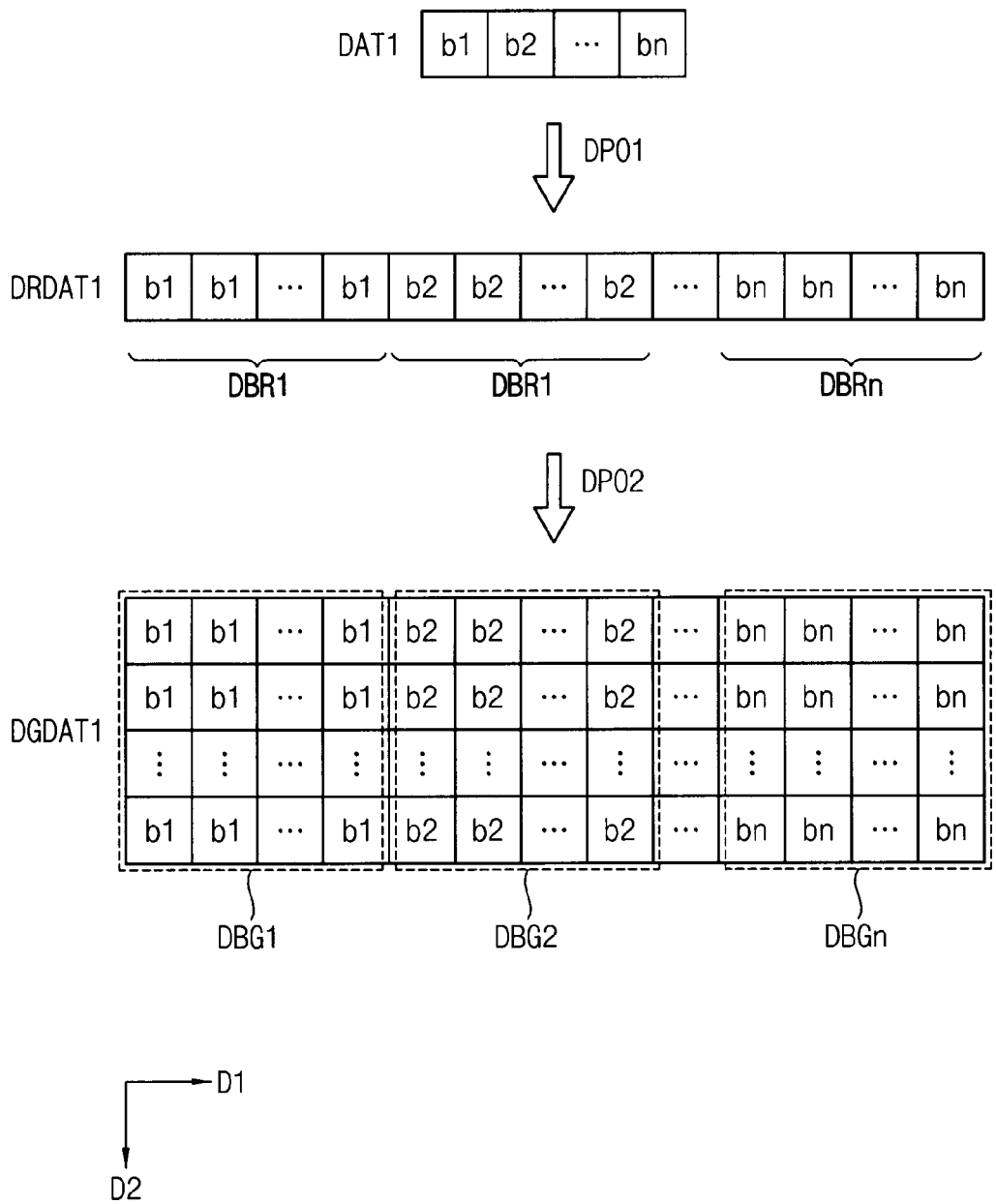
FIGS. 6A, 6B, 7A, 7B, 8A and 8B are diagrams for describing an operation of writing data of FIG. 5.
Figure 6B:
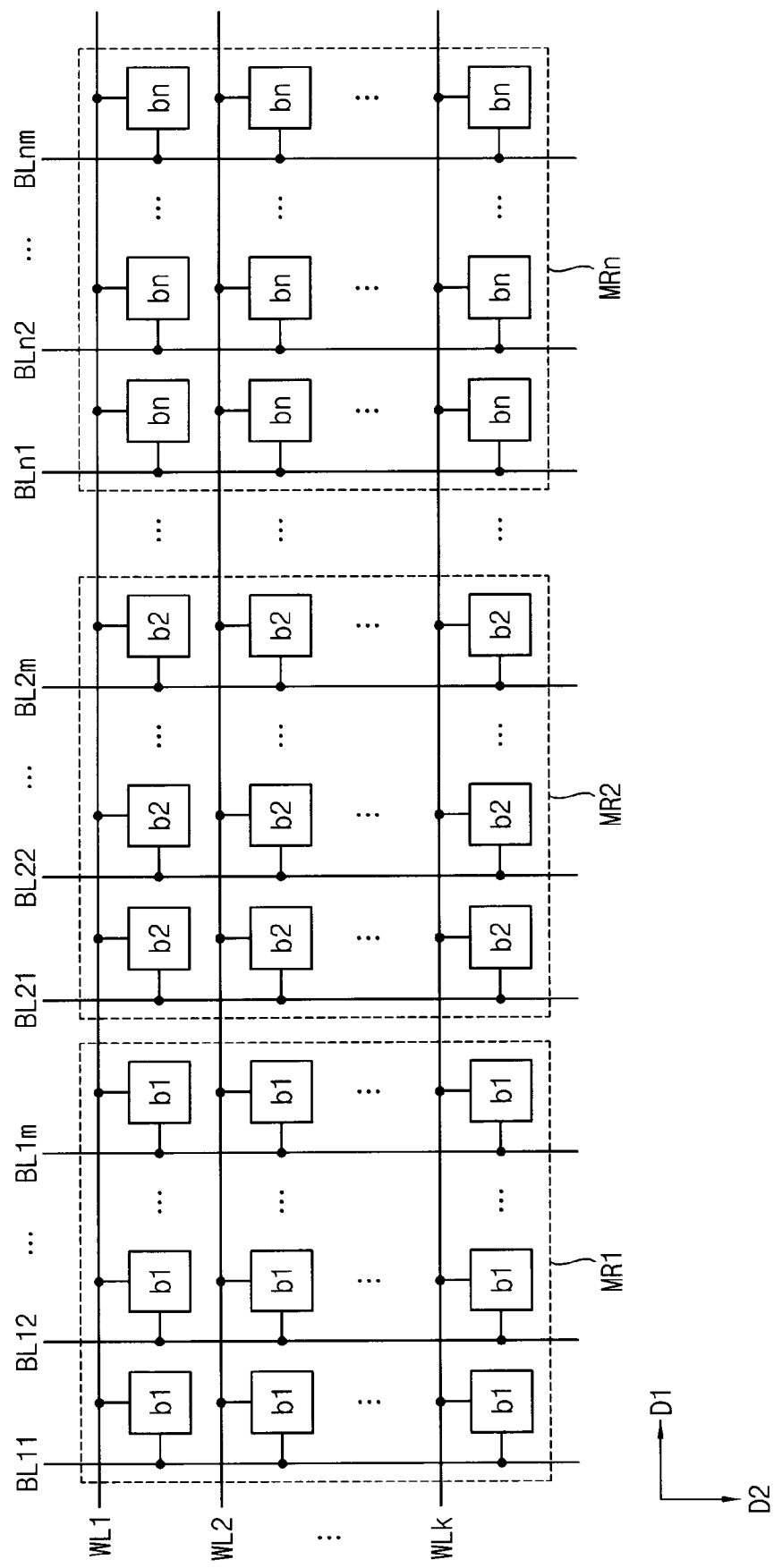

Referring to FIGS. 6A and 6B, a detailed example of the data write operation of FIG. 5 is illustrated.

Write data DAT1 may include first through n-th bits b1, b2, . . . , bn.

First duplicated data DRDAT1 generated by performing a first duplication operation DPO1 on the write data DAT1 may include first through n-th duplicated bit rows DBR1, DBR2, . . . , DBRn. The first duplicated bit row DBR1 may include m first bits b1, the second duplicated bit row DBR2 may include m second bits b2, and the n-th duplicated bit row DBRn may include m n-th bits bn. The first duplication operation DPO1 may represent a duplication in a first direction D1. For example, the first direction D1 may be a row direction or a wordline direction. The first duplicated data DRDAT1 may form one data unit for the data write operation.

Second duplicated data DGDAT1 generated by performing a second duplication operation DPO2 on the first duplicated data DRDAT1 may include first through n-th duplicated bit groups DBG1, DBG2, . . . , DBGn. The first duplicated bit group DBG1 may include k first duplicated bit rows DBR1, the second duplicated bit group DBG2 may include k second duplicated bit rows DBR2, and the n-th duplicated bit group DBGn may include k n-th duplicated bit rows DBRn. The second duplication operation DPO2 may represent a duplication in a second direction D2 crossing (e.g., perpendicular to) the first direction D1. For example, the second direction D2 may be a column direction or a bitline direction.

The first duplicated bit group DBG1 may be stored into a first memory region MR1 that includes memory cells connected to k wordlines WL1, WL2, ..., WLk and m bitlines BL11, BL12, ..., BL1m. Similarly, the second duplicated bit group DBG2 may be stored into a second memory region MR2 that includes memory cells connected to the k wordlines WL1 to WLk and m bitlines BL21, BL22, ..., BL2m. The n-th duplicated bit group DBGn may be stored into an n-th memory region MRn that includes memory cells connected to the k wordlines WL1 to WLk and m bitlines BLn1, BLn2, ..., BLnm.

In some example embodiments, each of the memory regions MR1 to MRn may be a region that is simultaneously sensed during a data read operation and may include memory cells that are connected to the same bitline, as illustrated in FIG. 6B. When one bit is copied and stored in the memory cells connected to the same bitline, a majority sensing performed in a method of reading data which will be described with reference to FIG. 13 may be efficiently performed.

Figure 7A:
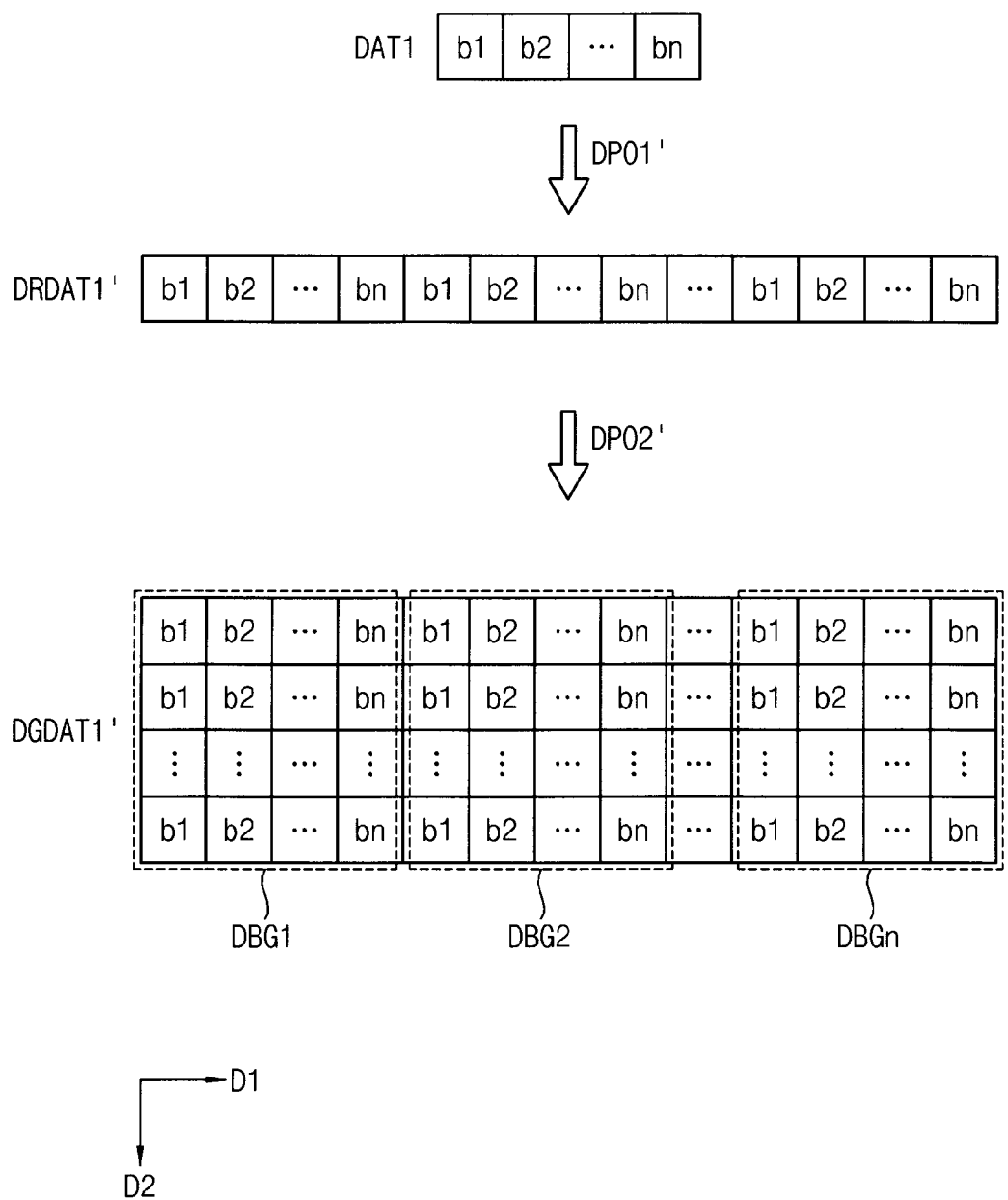
Figure 7B:
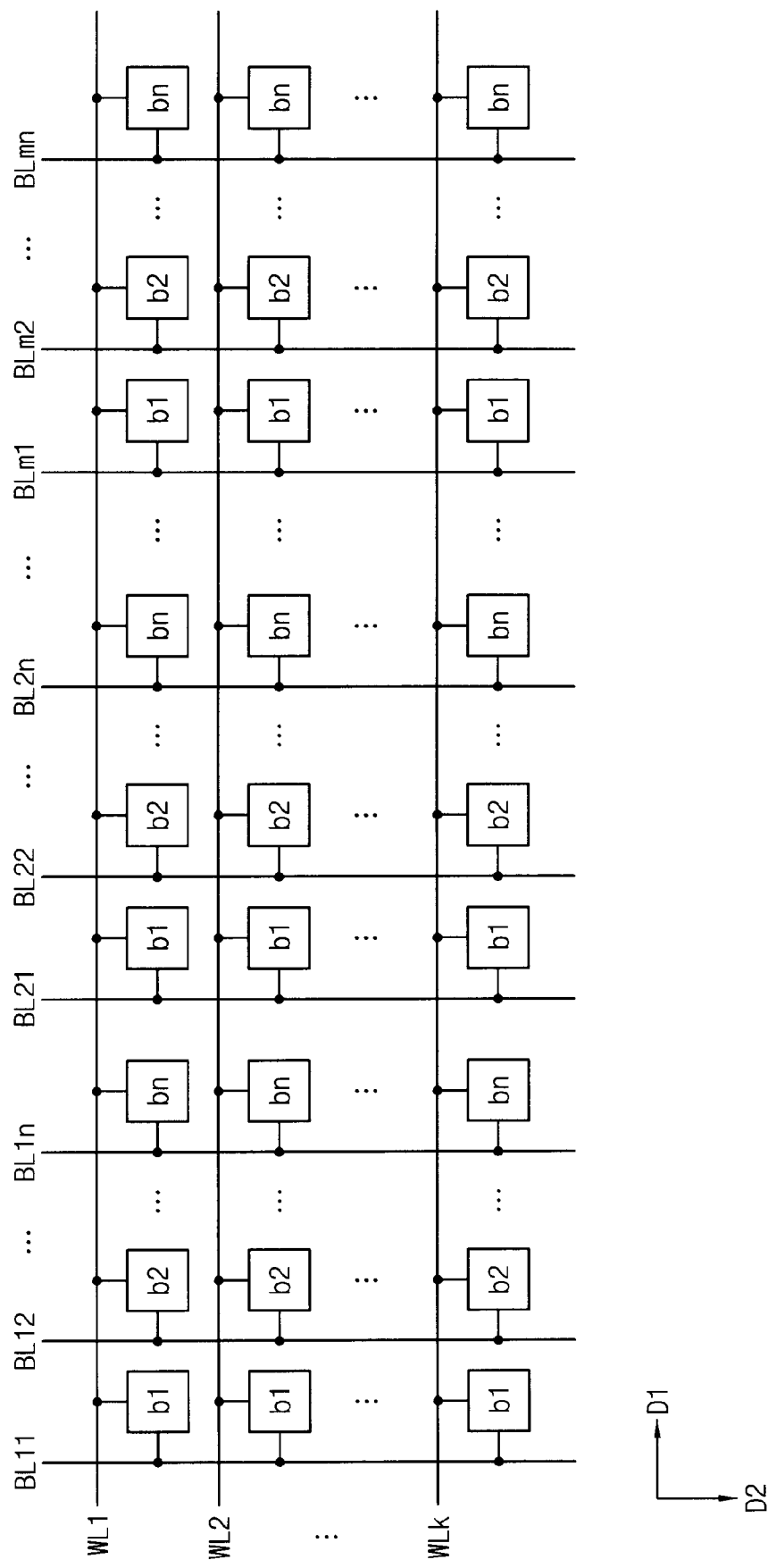

Referring to FIGS. 7A and 7B, another detailed example of the data write operation of FIG. 5 is illustrated. The descriptions repeated with FIGS. 6A and 6B will be omitted.

First duplicated data DRDAT1' may be generated by performing a first duplication operation DPO1' on the write data DAT1. Second duplicated data DGDAT1' may be generated by performing a second duplication operation DPO2' on the first duplicated data DRDAT1'. The second duplicated data DGDAT1' may be stored into a memory cell array.

In the example of FIGS. 6A and 6B, all the same bits may be arranged to be adjacent to each other in each of the first duplicated data DRDAT1 and the second duplicated data DGDAT1. On the other hand, in the example of FIGS. 7A and 7B, the same bits may not be adjacent to each other in the first duplicated data DRDAT1', and the same bits may be arranged to be partially adjacent to each other in the second duplicated data DGDAT1'.

Although not illustrated in detail, a combination of first bits b1, a combination of second bits b2, and a combination of n-th bits bn in the first duplicated data DRDAT1' of FIG. 7A may represent a first duplicated bit row, a second duplicated bit row and an n-th duplicated bit row, respectively. Similarly, a combination of first bits b1, a combination of second bits b2, and a combination of n-th bits bn in the second duplicated data DGDAT1' of FIG. 7A may represent a first duplicated bit group, a second duplicated bit group and an n-th duplicated bit group, respectively. Memory cells that store first bits b1 and are connected to bitlines BL11, BL21, ..., BLm1, memory cells that store second bits b2 and are connected to bitlines BL12, BL22, ..., BLm2, and memory cells that store n-th bits bn and are connected to bitlines BL1n, BL2n, ..., BLmn among memory cells in FIG. 7B may represent a first memory region, a second memory region and an n-th memory region, respectively.

Although FIGS. 6A, 6B, 7A and 7B illustrate that the plurality of bits is duplicated to have a specific arrangement, example embodiments are not limited thereto, and an arrangement of duplicated bits may be changed according to example embodiments. In addition, although FIGS. 6B and 7B illustrate that the duplicated bits are stored into the memory regions connected to the wordlines and the bitlines that are sequentially or continuously arranged, example embodiments are not limited thereto, and one memory region may be connected to wordlines and/or bitlines that are not sequentially or continuously arranged (e.g., that are spaced apart from each other).

In addition, although FIGS. 6A, 6B, 7A and 7B illustrate that the first duplication operation is performed in the row direction and the second duplication operation is performed in the column direction, example embodiments are not limited thereto. For example, a plurality of duplicated bit columns may be generated by copying the plurality of bits by units of bits in the column direction, and a plurality of duplicated bit groups may be generated by copying the plurality of duplicated bit columns by units of columns in the row direction, Referring to FIG. 8A, a memory cell array may include four memory blocks BLK1, BLK2, BLK3 and BLK4. The memory blocks BLK1 to BLK4 may be connected to one page buffer PGBUF through the same bitlines BLa. The memory blocks BLK1 to BLK4 may be the memory block BLKi of FIG. 4A or the memory block BLKj of FIG. 4B.

Each of the plurality of memory regions in which the plurality of duplicated bit groups is stored may include the memory blocks BLK1 to BLK4 connected to the same bitlines BLa and may correspond to a portion of the memory blocks BLK1 to BLK4.

For example, DUP1, DUP2, DUP3 and DUP4 may represent four duplicated bit rows including the same bit. DUP1 may represent a duplicated bit row generated by performing the first duplication operation, and DUP2, DUP3, and DUP4 may represent duplicated bit rows generated by performing the second duplication operation based on DUP1. The duplicated bit row DUP1 may be stored in memory cells connected to a wordline WL1a of the memory block BLK1, the duplicated bit row DUP2 may be stored in memory cells connected to a wordline WL2a of the memory block BLK2, the duplicated bit row DUP3 may be stored in memory cells connected to a wordline WL3a of the memory block BLK3, and the duplicated bit row DUP4 may be stored in memory cells connected to a wordline WL4a of the memory block BLK4. In other words, the memory cells, which are included in the memory blocks BLK1 to BLK4, are connected to the wordlines WL1a to WL4a and store the duplicated bit rows DUP1 to DUP4, may correspond to one memory region.

Figure 8A:
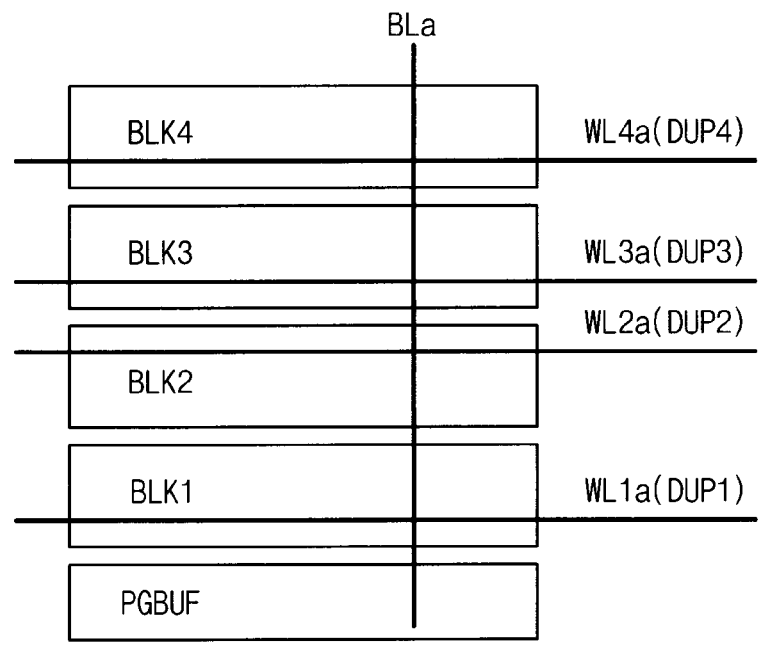
Figure 8B:
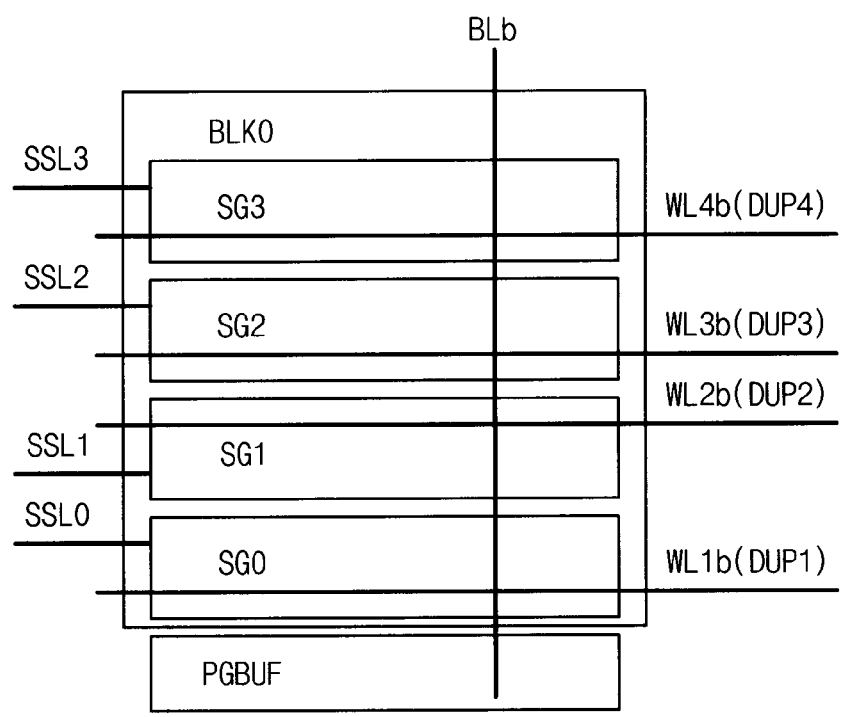

Referring to FIG. 8B, a memory block BLK0 included in a memory cell array may include four sub-groups (or string selection groups) SG0, SG1, SG2 and SG3. The sub-group SG0 may be connected to a string selection line SSL0, the sub-group SG1 may be connected to a string selection line SSL1, the sub-group SG2 may be connected to a string selection line SSL2, and the sub-group SG3 may be connected to a string selection line SSL3. The sub-groups SG0 to SG3 may be connected to one page buffer PGBUF through the same bitlines BLb. The memory block BLK0 may be the memory block BLKj of FIG. 4B.

Each of the plurality of memory regions in which the plurality of duplicated bit groups is stored may include the sub-groups SG0 to SG3 connected to the same bitlines BLb and may correspond to a portion of the sub-groups SG0 to SG3.

For example, the duplicated bit row DUP1 may be stored in memory cells connected to a wordline WL1b of the sub-group SG0, the duplicated bit row DUP2 may be stored in memory cells connected to a wordline WL2b of the sub-group SG1, the duplicated bit row DUP3 may be stored in memory cells connected to a wordline WL3b of the sub-group SG2, and the duplicated bit row DUP4 may be stored in memory cells connected to a wordline WL4b of the sub-group SG3. In other words, the memory cells, which are included in the sub-groups SG0 to SG3 of the memory block BLK0, are connected to the wordlines WL1b to WL4b and store the duplicated bit rows DUP1 to DUP4, may correspond to one memory region.

Although FIGS. 8A and 8B illustrate a certain number of memory blocks and sub-groups, example embodiments are not limited thereto, and the number of memory blocks and/or sub-groups included in one memory region may be changed according to example embodiments.

Figure 9:
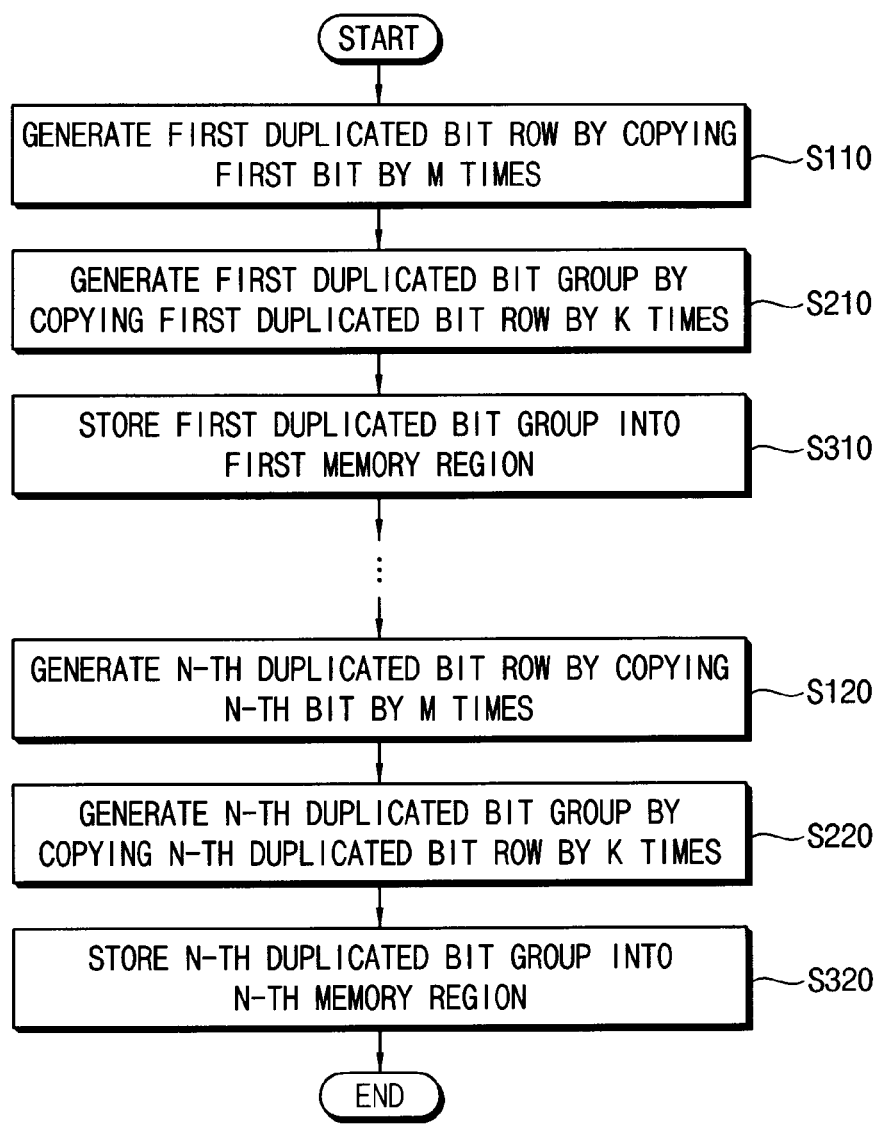
FIG. 9 is a flowchart illustrating another detailed example of a method of writing data in a memory device of FIG. 1.

FIG. 9 is a flowchart illustrating another detailed example of a method of writing data in a memory device of FIG. 1. The descriptions repeated with FIG. 5 will be omitted.

Referring to FIG. 9, the example of FIG. 9 may be substantially the same as the example of FIG. 5, except that the operation order is changed in the example of FIG. 9. Steps S110, S120, S210, S220, S310 and S320 in FIG. 9 may be substantially the same as steps S110, S120, S210, S220, S310 and S320 in FIG. 5, respectively.

In the example of FIG. 5, the first duplication operation may be sequentially performed on all bits of the write data, the second duplication operation may be sequentially performed on all duplicated bit rows after the first duplication operation is completed, and all duplicated bit groups may be sequentially stored after the second duplication operation is completed. On the other hand, in the example of FIG. 9, the first duplication operation, the second duplication operation and the storage operation are sequentially performed on the first bit of the write data, and subsequently, the first duplication operation, the second duplication operation and the storage operation may be sequentially performed on the second bit of the write data, and finally, the first duplication operation, the second duplication operation and the storage operation may be sequentially performed on the n-th bit of the write data.

Figure 10:
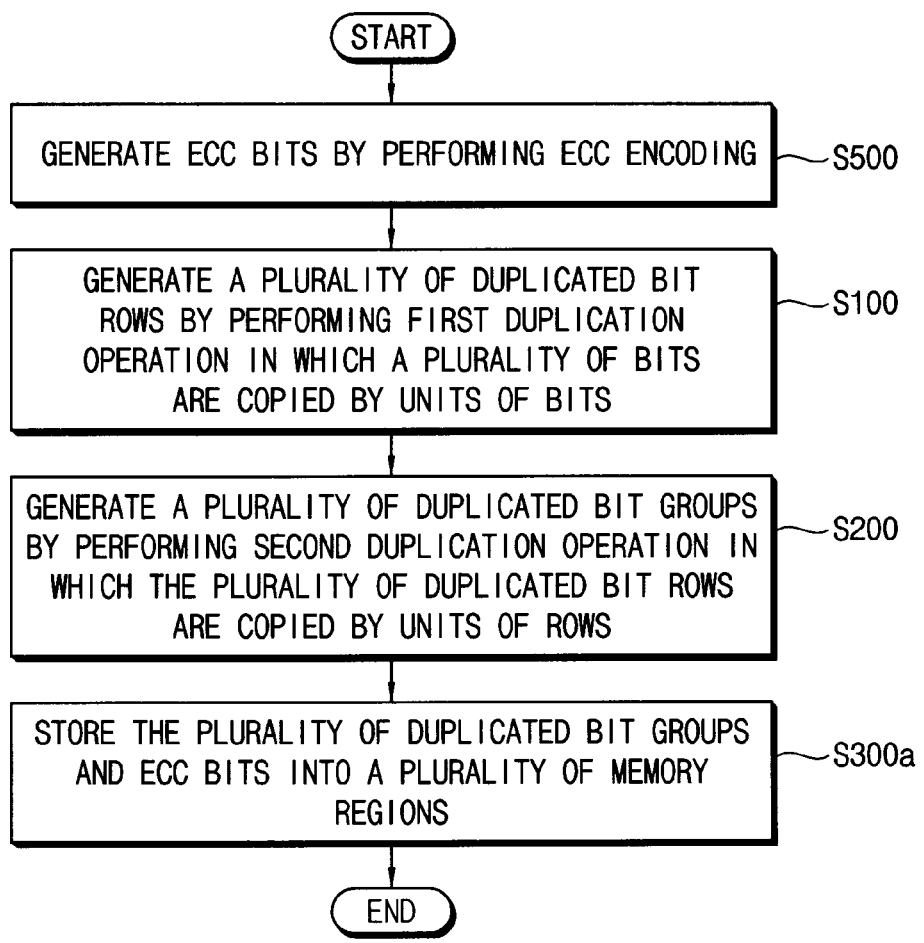
FIG. 10 is a flowchart illustrating a method of writing data in a memory device according to example embodiments.

FIG. 10 is a flowchart illustrating a method of writing data in a memory device according to example embodiments. The descriptions repeated with FIG. 1 will be omitted.

Referring to FIG. 10, the example of FIG. 10 may be substantially the same as the example of FIG. 1, except that step S500 is added to the example of FIG. 10.

Before the first duplication operation and the second duplication operation are performed, ECC bits may be generated by performing an ECC encoding on the write data (e.g., original data) (step S500). The ECC bits may be used for recovering data when an error correction scheme of a majority sensing and/or a majority voting is failed in a method of reading data which will be described with reference to FIG. 20 and the like. For example, the ECC encoding may be performed by a memory controller (e.g., the memory controller 20 in FIG. 2).

Steps S100 and S200 in FIG. 10 after step S500 may be substantially the same as steps S100 and S200 in FIG. 1, respectively. Step S300a in FIG. 10 may be substantially the same as step S300 in FIG. 1, except that the ECC bits are stored together with the plurality of duplicated bit groups.

Figure 11:
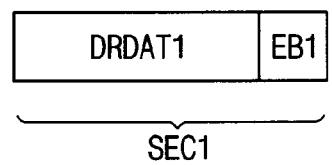
FIGS. 11, 12A and 12B are diagrams for describing a method of writing data in a memory device of FIGS. 1 and 10.
Figure 12A:
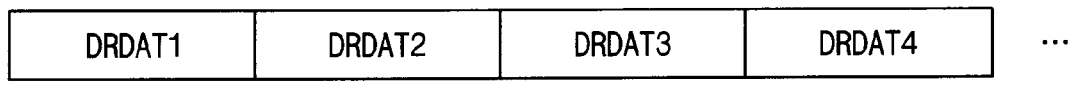
Figure 12B:
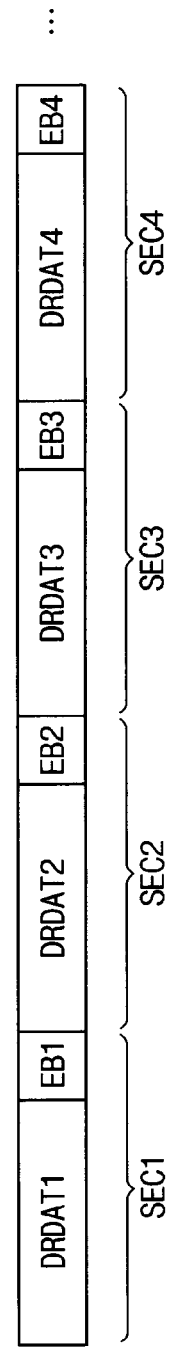

FIGS. 11, 12A and 12B are diagrams for describing a method of writing data in a memory device of FIGS. 1 and 10.

Referring to FIG. 11, when the method of FIG. 10 is performed, first duplicated data DRDAT1 generated by performing the first duplication operation on write data DAT1 and ECC bits EB1 generated by performing the ECC encoding on the write data DAT1 may form one data unit (e.g., one sector SEC1) for a data write operation.

Referring to FIG. 12A, when the method of FIG. 1 is performed, a plurality of write data may be provided. Each of a plurality of first duplication data DRDAT1, DRDAT2, DRDAT3 and DRDAT4 generated by performing the first duplication operation on the plurality of write data may form one data unit for a data write operation.

Referring to FIG. 12B, when the method of FIG. 10 is performed, a plurality of write data may be provided. One of a plurality of first duplication data DRDAT1, DRDAT2, DRDAT3 and DRDAT4 generated by performing the first duplication operation on the plurality of write data and a respective one of ECC bits EB1, EB2, EB3 and EB4 generated by performing the ECC encoding on the plurality of write data may form a respective one of a plurality of sectors SEC1, SEC2, SEC3 and SEC4.

Figure 13:
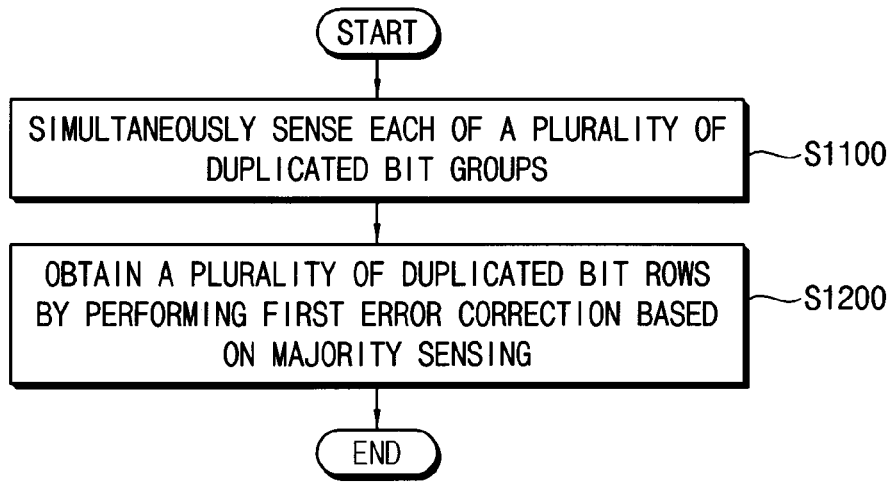
FIG. 13 is a flowchart illustrating a method of reading data from a memory device according to example embodiments.

FIG. 13 is a flowchart illustrating a method of reading data from a memory device according to example embodiments.

Referring to FIG. 13, a memory device performing a method of reading data according to example embodiments may include a memory cell array that stores data and a majority sensing circuit that performs a majority sensing on read data to be read or retrieved. Configurations of the memory device and a memory system including the memory device may be substantially the same as that described with reference to FIGS. 2 and 3.

In the method of reading data from the memory device according to example embodiments, the method of reading data of FIG. 13 may be performed when the read data is written or stored based on the method of writing data of FIG. 1. In other words, the method of reading data of FIG. 13 may be performed when the read data including a plurality of bits is written in a scheme such that the plurality of bits are copied by units of bits to generate a plurality of duplicated bit rows, the plurality of duplicated bit rows are copied by units of rows to generate a plurality of duplicated bit groups, and the plurality of duplicated bit groups are stored into a plurality of memory regions included in the memory device, respectively.

Each of the plurality of duplicated bit groups is simultaneously sensed (step S1100). The plurality of duplicated bit rows is obtained by performing a first error correction based on a majority sensing on a sensing result of the plurality of duplicated bit groups (step S1200). Steps S1100 and S1200 may be performed when a read command and a read address are provided or received. For example, when the same bit is copied (or duplicated) and stored in a plurality of memory cells connected to the same bitlines, the above-described simultaneous sensing and majority sensing may be performed on a bitline basis (e.g., units of bitlines or bitline by bitline). The simultaneous sensing and majority sensing will be described in detail with reference to FIGS. 14 through 19.

In the method of reading data from the memory device according to example embodiments, each bit of the duplicated bit rows may be obtained by performing the majority sensing on the read data written by the double-duplication operation. By performing the above-described majority sensing, the data integrity may be ensured or guaranteed without an external ECC. Accordingly, the response speed may be improved or enhanced, and processing-in-memory or computing-in-memory may be efficiently performed.

Figure 14:
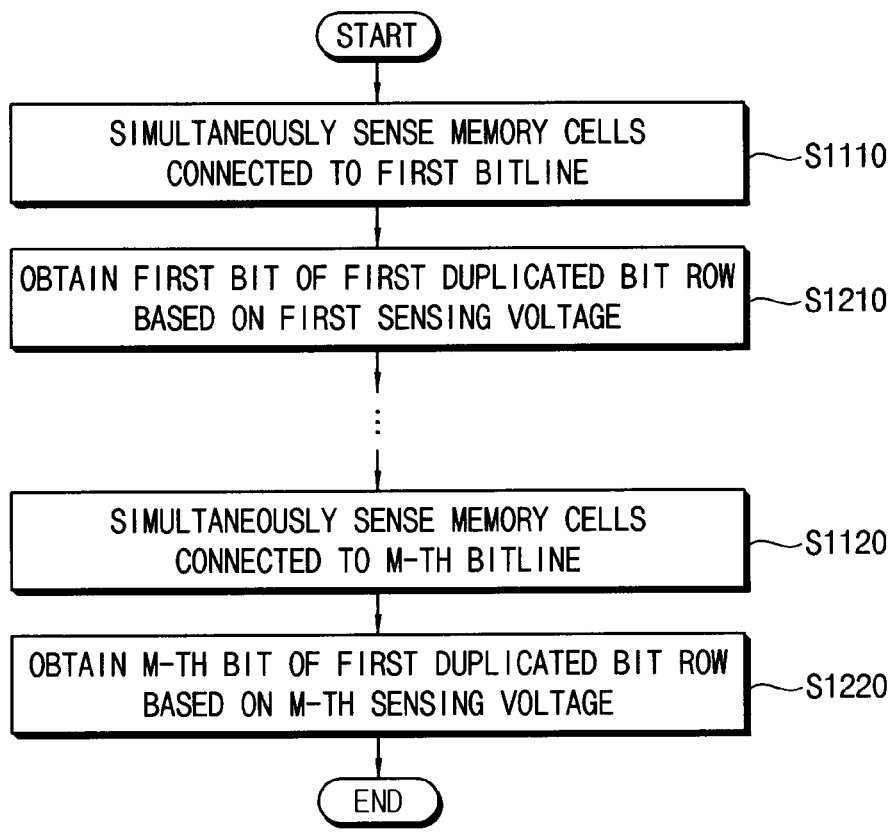
FIG. 14 is a flowchart illustrating a detailed example of a method of reading data from a memory device of FIG. 13.

FIG. 14 is a flowchart illustrating a detailed example of a method of reading data from a memory device of FIG. 13. The descriptions repeated with FIGS. 5 and 9 will be omitted.

Referring to FIGS. 6A, 6B, 13 and 14, read data read or retrieved from the memory device by the method of reading data according to example embodiments may be written or stored by the method of writing data described with reference to FIGS. 5 through 9. For example, the read data may include the first through n-th bits, the first duplicated bit row may be generated by copying the first bit m times, the first duplicated bit group may be generated by copying the first duplicated bit row k times, and the first duplicated bit group may be stored in the first memory region. FIG. 14 illustrates an operation of obtaining the first duplicated bit row by performing the majority sensing on the first duplicated bit group.

For example, when simultaneously sensing each of the plurality of duplicated bit groups (step S1100), first bits b1 stored in memory cells connected to the first bitline BL11 among a plurality of first bits b1 included in the first duplicated bit group DBG1 stored in the first memory region MR1 may be simultaneously or concurrently sensed (step S1110). When obtaining the plurality of duplicated bit rows by performing the first error correction based on the majority sensing (step S1200), one bit (e.g., the foremost bit or a first bit) of the first duplicated bit row DBR1 may be obtained (e.g., read) based on a first sensing voltage (step S1210). The first sensing voltage may be obtained by simultaneously sensing the memory cells that are connected to the first bitline BL11 and storing the first bits b1.

Similarly, first bits b1 stored in memory cells connected to the m-th bitline BL1*m* may be simultaneously sensed (step S1120), and another bit (e.g., the last bit or a m-th bit) of the first duplicated bit row DBR1 may be obtained based on a m-th sensing voltage (step S1220). The m-th sensing voltage may be obtained by simultaneously sensing the memory cells that are connected to the m-th bitline BL1*m* and storing the first bits b1.

Although FIG. 14 illustrates only the operation of obtaining the first duplicated bit row DBR1 by performing the majority sensing on the first duplicated bit group DBG1, each of an operation of obtaining the second duplicated bit row DBR2 by performing the majority sensing on the second duplicated bit group DBG2 and an operation of obtaining the n-th duplicated bit row DBRn by performing the majority sensing on the n-th duplicated bit group DBGn may be substantially the same as the operation of obtaining the first duplicated bit row DBR1.

Figure 15:
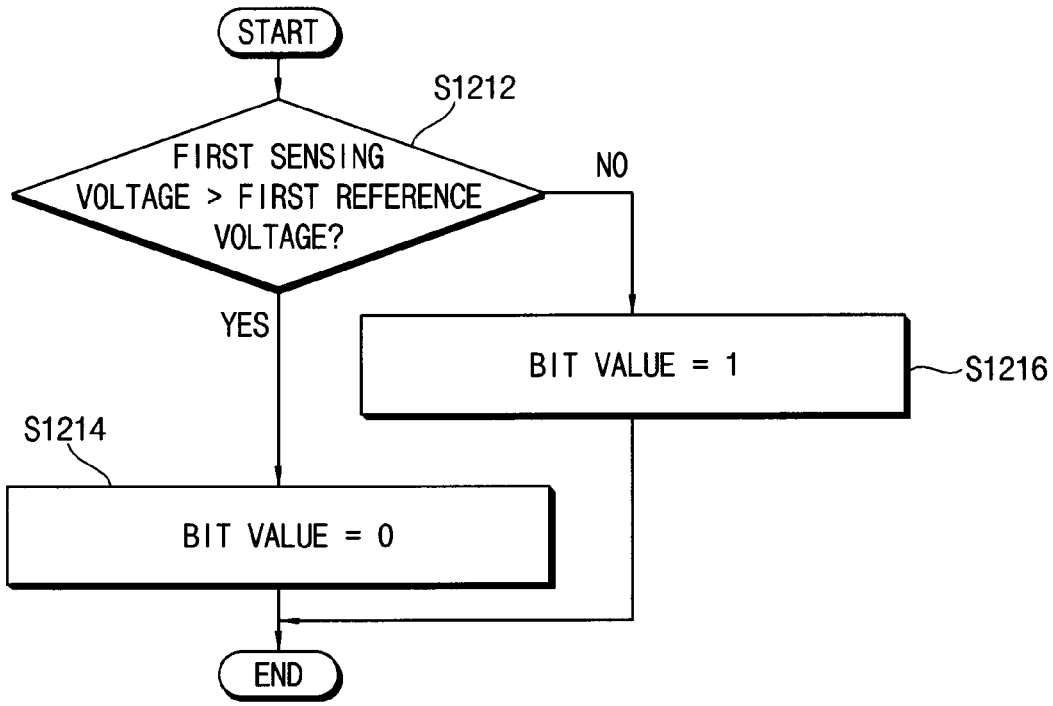
FIG. 15 is a flowchart illustrating an example of step S1210 in FIG. 14.
Figure 16:
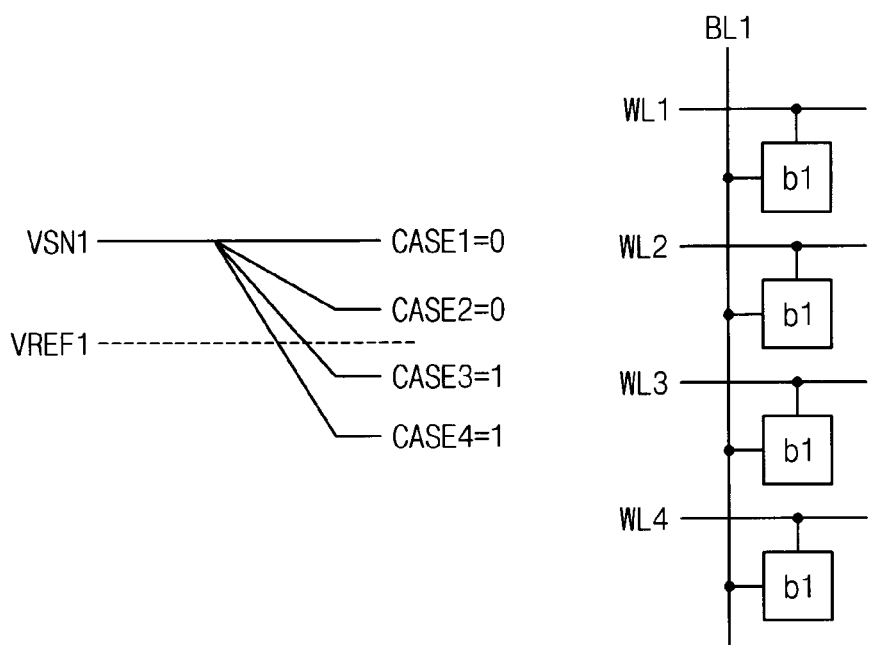
FIG. 16 is a diagram for describing an operation of FIG. 15.

FIG. 15 is a flowchart illustrating an example of step S1210 in FIG. 14. FIG. 16 is a diagram for describing an operation of FIG. 15.

Referring to FIGS. 14, 15 and 16, when obtaining the one bit (e.g., the foremost bit) of the first duplicated bit row DBR1 based on the first sensing voltage (step S1210), a first sensing voltage VSN1 may represent a voltage at a sensing node that is included in a page buffer connected to the first bitline BL1.

The first sensing voltage VSN1 may be compared with a first reference voltage VREF1 (step S1212). When the first sensing voltage VSN1 is higher than the first reference voltage VREF1 (step S1212: YES), the one bit of the first duplicated bit row DBR1 may be obtained as a first value (e.g., '0') (step S1214). When the first sensing voltage VSN1 is lower than or equal to the first reference voltage VREF1 (step S1212: NO), the one bit of the first duplicated bit row DBR1 may be obtained as a second value (e.g., '1') (step S1216).

Typically in a memory device, memory cells may be classified or identified into an on-cell and an off-cell based on a level of a sensing voltage (e.g., the voltage level at the sensing node) and thus may be classified into a binary bit '0' or a binary bit '1.' Hereinafter, for convenience, example embodiments will be described that the off-cell is mapped to '0' (e.g., the first value) and the on-cell is mapped to '1' (e.g., the second value).

When one memory cell is sensed, the level change of the sensing voltage may be limited or restricted. For example, at an initial sensing time, the sensing voltage may have a level of a power supply voltage as the sensing node is precharged to the power supply voltage. After that, when the sensing operation is performed, a cell current may flow through the on-cell so that the sensing voltage decreases from and becomes lower than the level of the power supply voltage and the cell current may not flow through the off-cell so that the sensing voltage maintains the level of the power supply voltage.

On the other hand, when a plurality of memory cells is simultaneously sensed according to example embodiments, the level change of the sensing voltage may be more various than described above. FIG. 16 illustrates an example where four memory cells that are connected to one bitline BL1 and four wordlines WL1, WL2, WL3 and WL4 are simultaneously sensed. As the number of on-cells sensed simultaneously on the same bitline increases, the amount of the cell current may increase and the sensing voltage may more decrease. As the number of off-cells sensed simultaneously on the same bitline increases, the amount of the cell current may decrease and the sensing voltage may less decrease and may approach the level of the power supply voltage.

For example, CASE1 where the first sensing voltage VSN1 has the highest level may represent a case in which all four memory cells are off-cells (e.g., '0'). In CASE1, it may be determined that no bit error has occurred, and the one bit (e.g., the foremost bit) of the first duplicated bit row DBR1 may be sensed as '0.' CASE2 where the level of the first sensing voltage VSN1 is higher than the level of the first reference voltage VREF1 but lower than CASE1 may represent a case in which three memory cells are off-cells (e.g., '0') and one memory cell is an on-cell (e.g., '1'). In CASE2, it may be determined that one bit error has occurred by the one on-cell, and the one bit of the first duplicated bit row DBR1 may be sensed as '0' by correcting the bit error based on the majority sensing.

Similarly, CASE4 may represent a case in which all four memory cells are on-cells (e.g., '1'). In CASE4, the one bit of the first duplicated bit row DBR1 may be sensed as '1.' CASE3 may represent a case in which three memory cells are on-cells (e.g., '1') and one memory cell is an off-cell (e.g., '0'). In CASE3, the one bit of the first duplicated bit row DBR1 may be sensed as '1' by correcting the bit error based on the majority sensing.

In this manner, the error correction may be performed based on the majority sensing in which the value with a relatively large number is selected as the bit value.

Figure 17:
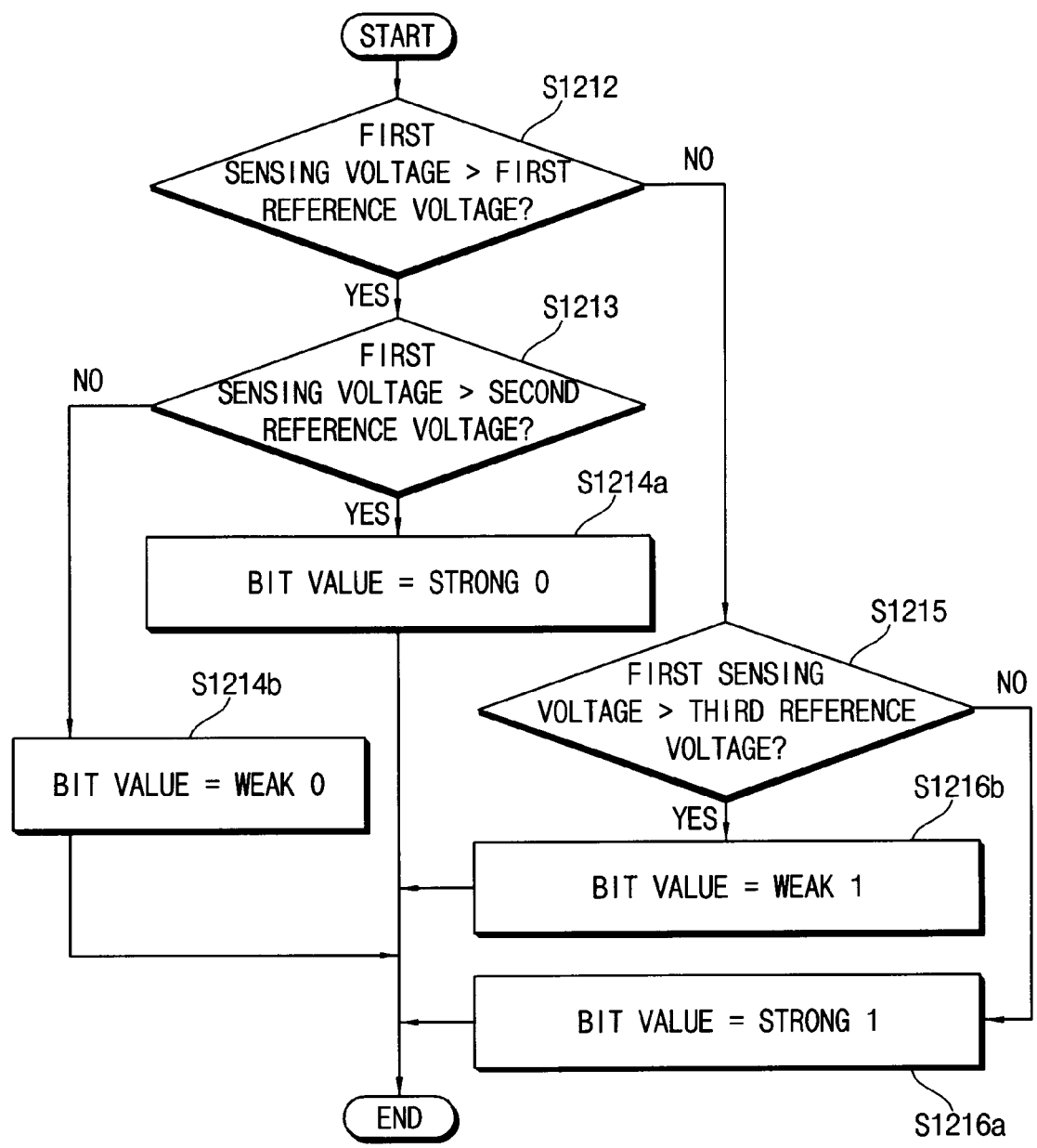
FIG. 17 is a flowchart illustrating another example of step S1210 in FIG. 14.
Figures 18, 19:
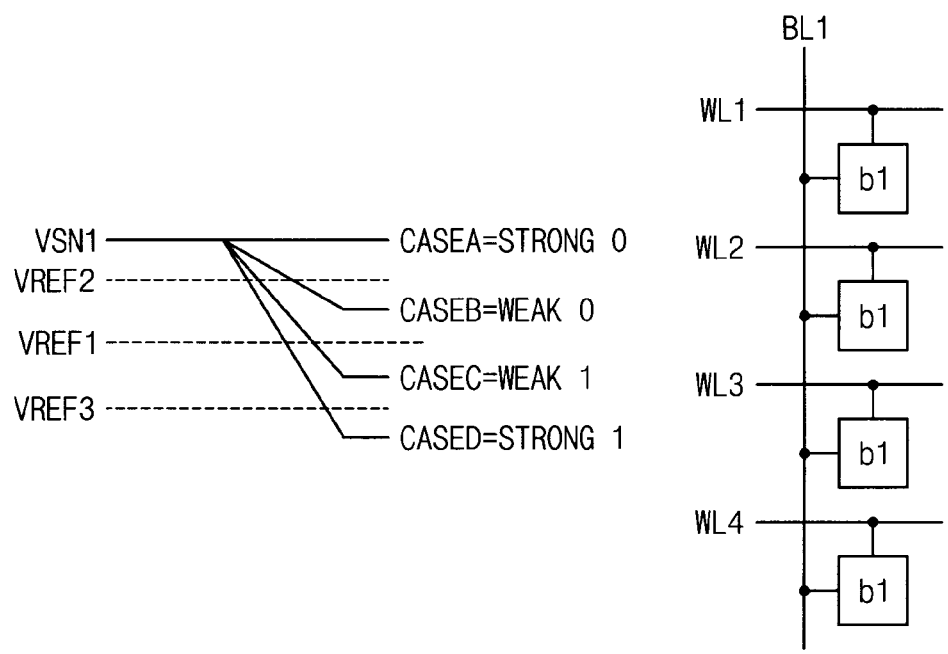
FIG. 18 is a diagram for describing an operation of FIG. 17.
FIG. 19 is a diagram for describing a method of reading data from a memory device according to example embodiments.

FIG. 17 is a flowchart illustrating another example of step S1210 in FIG. 14. FIG. 18 is a diagram for describing an operation of FIG. 17. The descriptions repeated with FIGS. 15 and 16 will be omitted.

Referring to FIGS. 14, 17 and 18, when obtaining the one bit (e.g., the foremost bit) of the first duplicated bit row DBR1 based on the first sensing voltage (step S1210), step S1212 in FIG. 17 may be substantially the same as step S1212 in FIG. 15.

When the first sensing voltage VSN1 is higher than the first reference voltage VREF1 (step S1212: YES), the first sensing voltage VSN1 may be compared with a second reference voltage VREF2 higher than the first reference voltage VREF1 (step S1213). When the first sensing voltage VSN1 is higher than the second reference voltage VREF2

(step S1213: YES), the one bit of the first duplicated bit row DBR1 may be obtained as 'STRONG 0' (step S1214a). When the first sensing voltage VSN1 is lower than or equal to the second reference voltage VREF2 (step S1213: NO), the one bit of the first duplicated bit row DBR1 may be obtained as 'WEAK 0' (step S1214b).

When the first sensing voltage VSN1 is lower than or equal to the first reference voltage VREF1 (step S1212: NO), the first sensing voltage VSN1 may be compared with a third reference voltage VREF3 lower than the first reference voltage VREF1 (step S1215). When the first sensing voltage VSN1 is higher than the third reference voltage VREF3 (step S1215: YES), the one bit of the first duplicated bit row DBR1 may be obtained as 'WEAK 1' (step S1216b). When the first sensing voltage VSN1 is lower than or equal to the third reference voltage VREF3 (step S1215: NO), the one bit of the first duplicated bit row DBR1 may be obtained as 'STRONG 1' (step S1216a).

CASEA, CASEB, CASEC and CASED in FIG. 18 may be substantially the same as CASE1, CASE2, CASE3 and CASE4 in FIG. 16, respectively. In 'STRONG 0' of CASEA and 'STRONG 1' of CASED, it may be determined that no bit error has occurred, an additional error correction may not be required, and thus the one bit may be finally sensed as '0' in CASEA and '1' in CASED. However, in 'WEAK 0' of CASEB and 'WEAK 1' of CASEC, since it is determined that a bit error has occurred, the additional error correction may be required, and thus the one bit may be primarily sensed as '0' in CASEB and '1' in CASEC and the additional error correction which will be described with reference to FIG. 20 may be further performed.

Although only step S1210 in FIG. 14 is described with reference to FIGS. 15 through 18, step S1220 in FIG. 14 may be substantially the same as that described with reference to FIGS. 15 through 18.

FIG. 19 is a diagram for describing a method of reading data from a memory device according to example embodiments.

Referring to FIG. 19, DUP1, DUP2, DUP3 and DUP4 may represent four duplicated bit rows that are stored in memory cells connected to eight bitlines BL1, BL2, BL3, BL4, BL5, BL6, BL7 and BL8 and include the same bits. SR represents results of performing the majority sensing on DUP1, DUP2, DUP3 and DUP4.

Results of sensing for the bitlines BL1, BL2, BL4, BL5, BL6 and BL8 may correspond to CASE3 in FIG. 16 or CASEC in FIG. 18, and a value of '1' may be obtained by performing the error correction based on the majority sensing. Results of sensing for the bitlines BL3 and BL7 may correspond to CASE4 in FIG. 16 or CASED in FIG. 18, and a value of '1' may be obtained without the error correction.

Figure 20:
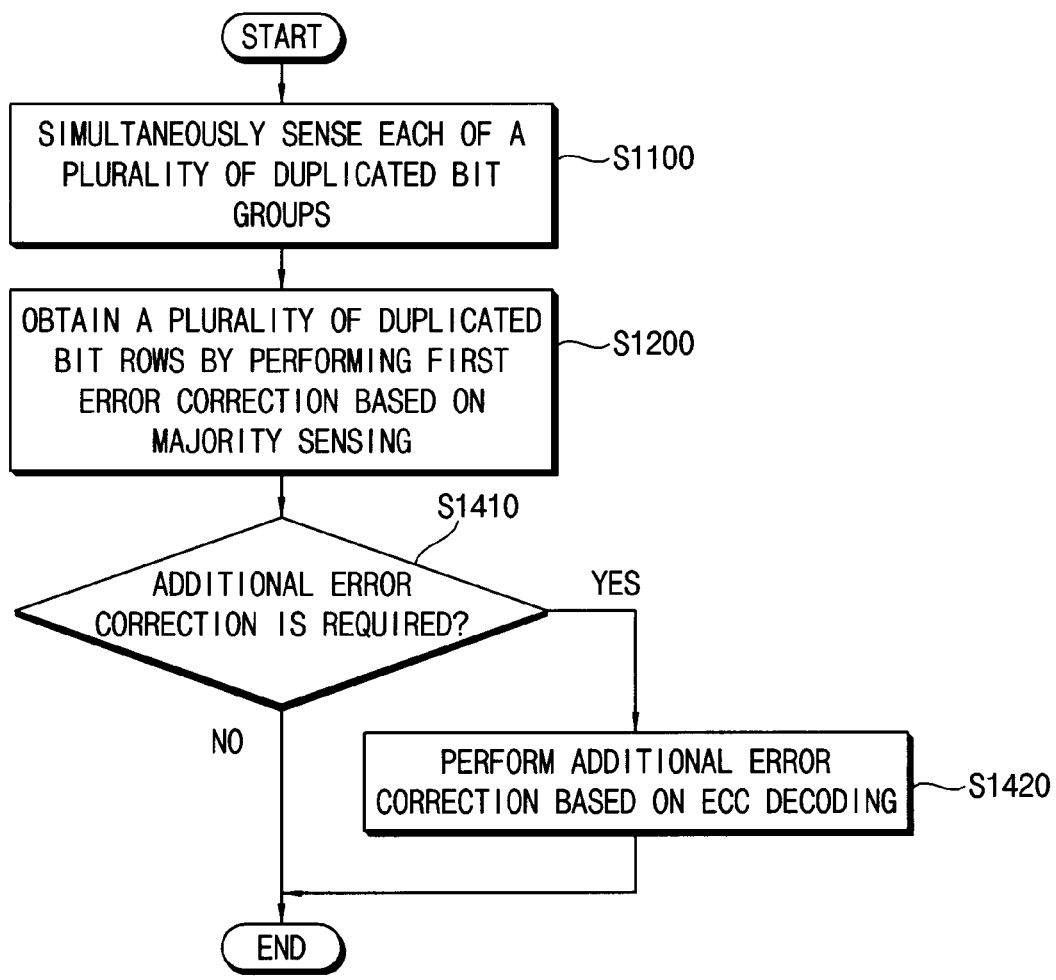
FIGS. 20, 21 and 22 are flowcharts illustrating a method of reading data from a memory device according to example embodiments.
Figure 21:
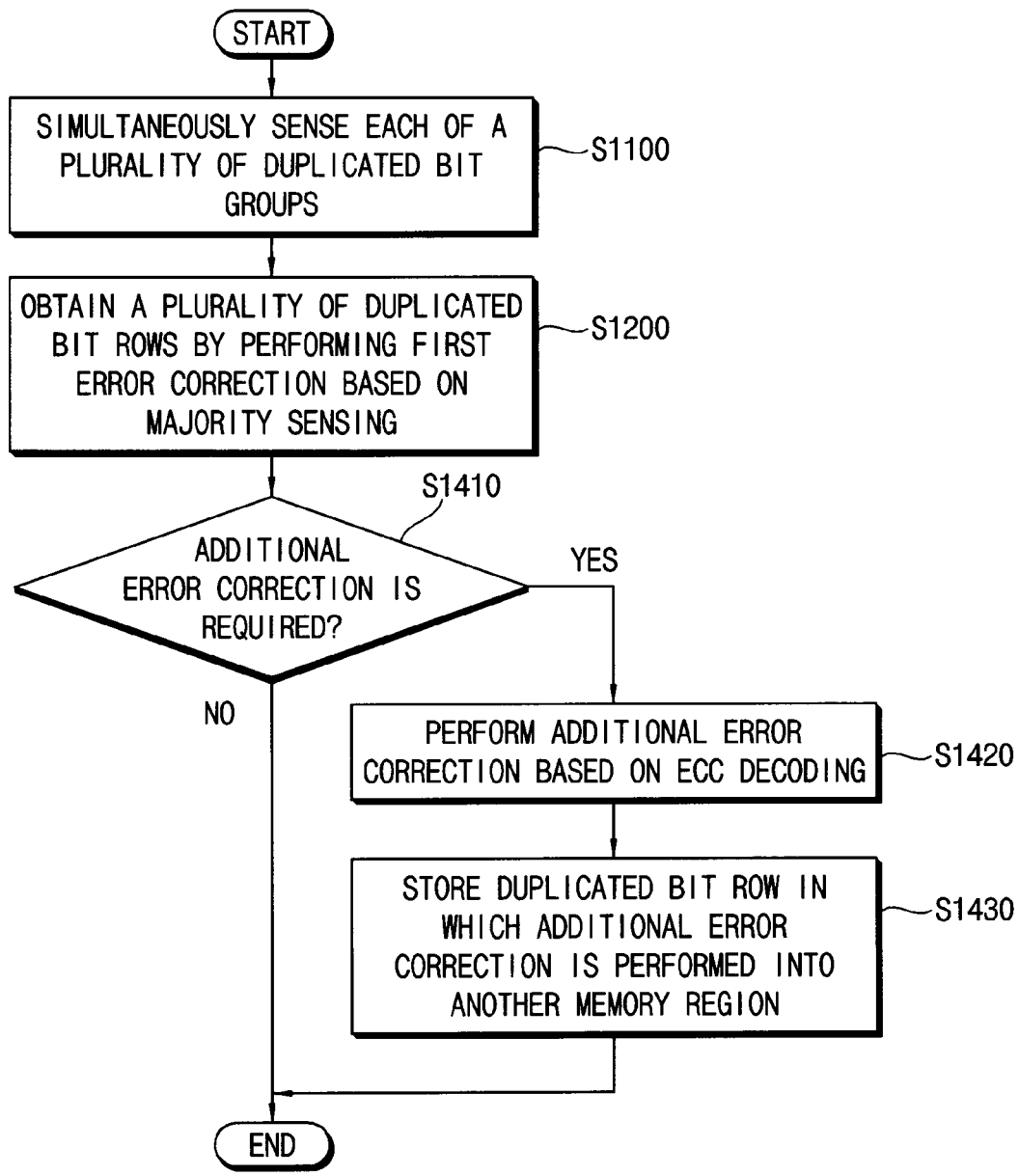
Figure 22:
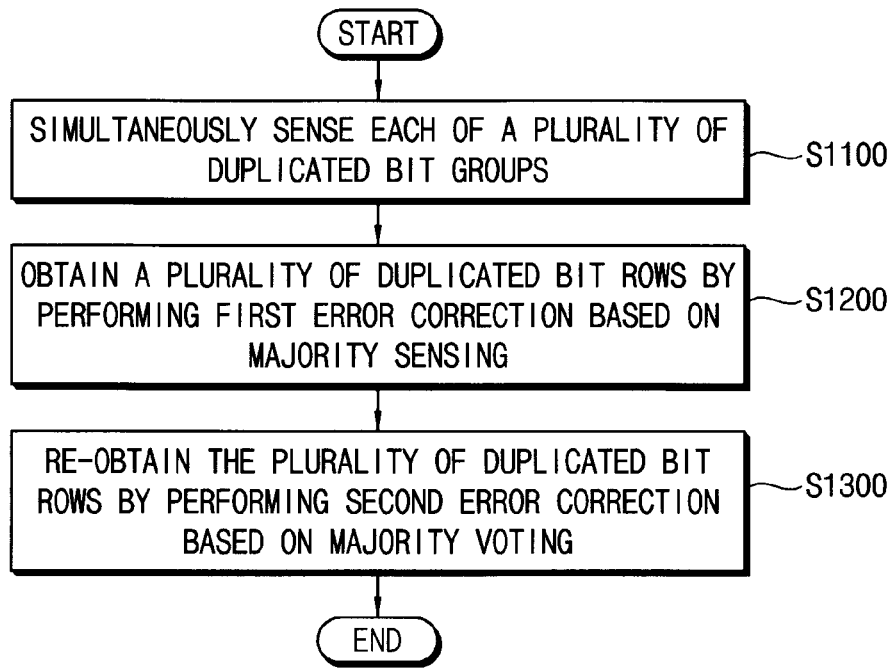

FIGS. 20, 21 and 22 are flowcharts illustrating a method of reading data from a memory device according to example embodiments. The descriptions repeated with FIG. 13 will be omitted.

Referring to FIG. 20, the example of FIG. 20 may be substantially the same as the example of FIG. 13, except that steps S1410 and S1420 are added to the example of FIG. 20.

After step S1200 is performed, when it is determined that an additional error correction is required for at least one of the plurality of duplicated bit rows (e.g., the first duplicated bit row) (step S1410: YES), the additional error correction may be performed on the at least one of the plurality of duplicated bit rows based on an ECC decoding (step S1420). For example, the additional error correction may be performed in 'WEAK 0' of CASEB and 'WEAK 1' of CASEC (e.g., when the accuracy of the error correction based on the majority sensing decreases). For example, the ECC decoding may be performed by a memory controller (e.g., the memory controller 20 in FIG. 2).

The ECC decoding in step S1420 of FIG. 20 may be performed based on the ECC bits that are generated in step S500 of FIG. 10 and stored in step S300a of FIG. 10. In other words, the method of reading data of FIG. 20 may be performed when the read data is written based on the method of writing data of FIG. 10, e.g., when the plurality of duplicated bit groups and the ECC bits are stored together.

Referring to FIG. 21, the example of FIG. 21 may be substantially the same as the example of FIG. 20, except that step S1430 is added to the example of FIG. 21.

After step S1420 is performed, the at least one of the plurality of duplicated bit rows (e.g., the first duplicated bit row) in which the additional error correction is performed may be stored into another memory region (e.g., a memory region other than the first memory region) (step S1430). In other words, data recovered using the ECC may be entered into a reclaim phase by the memory controller and may be stored in a new memory region as error corrected data. By performing such write-back operation, it may be prevented to repeatedly perform the ECC when the same data is read later.

Referring to FIG. 22, the example of FIG. 22 may be substantially the same as the example of FIG. 13, except that step S1300 is added to the example of FIG. 22.

A memory device performing a method of reading data according to example embodiments may include a memory cell array that stores data, a majority sensing circuit that performs a majority sensing on read data to be read or retrieved, and a majority voting circuit that performs a majority voting on the read data. Configurations of the memory device and a memory system including the memory device may be substantially the same as that described with reference to FIGS. 2 and 3.

The plurality of duplicated bit rows is re-obtained by performing a second error correction based on a majority voting on the plurality of duplicated bit rows that are obtained by performing step S1200 (step S1300). The majority voting will be described in detail with reference to FIGS. 23 through 26.

In the method of reading data from the memory device according to example embodiments, each bit of the duplicated bit rows may be obtained by performing the majority sensing and the majority voting on the read data written by the double-duplication operation. By performing the multi-step error correction including the above-described majority sensing and majority voting, the data integrity may be ensured or guaranteed without an external ECC.

Figure 23:
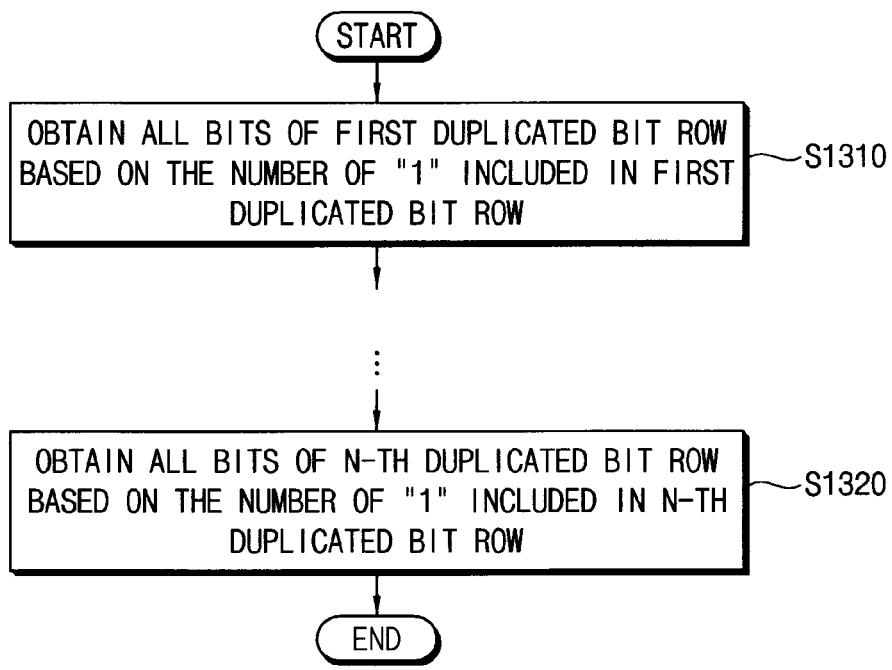
FIG. 23 is a flowchart illustrating an example of step S1300 in FIG. 22.

FIG. 23 is a flowchart illustrating an example of step S1300 in FIG. 22.

Referring to FIGS. 22 and 23, when re-obtaining the plurality of duplicated bit rows by performing the second error correction based on the majority voting (step S1300), all of a plurality of first bits included in the first duplicated bit row may be obtained again (or re-obtained) based on the number of first bits having a value of '1' (e.g., the second value) among the plurality of first bits included in the first duplicated bit row (step S1310). For example, all bits included in the first duplicated bit row obtained by step S1300 may have the same value.

Similarly, all of a plurality of n-th bits included in the n-th duplicated bit row may be obtained again based on the number of n-th bits having the value of '1' among the plurality of n-th bits included in the n-th duplicated bit row (step S1320).

Figure 24:
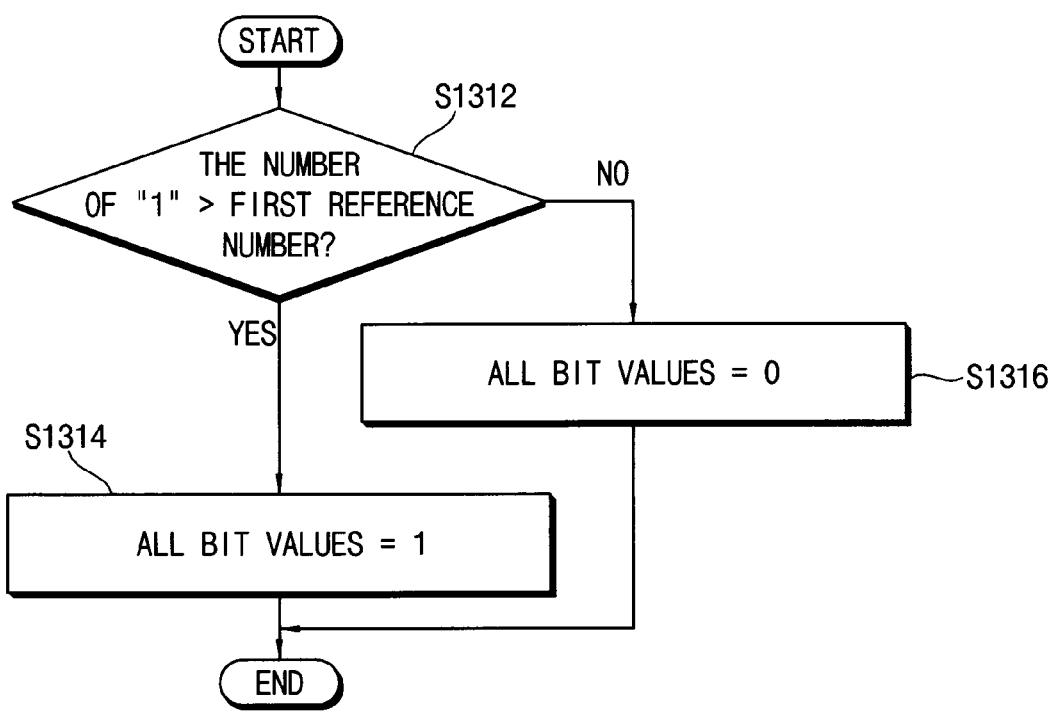
FIGS. 24 and 25 are flowcharts illustrating examples of step S1310 in FIG. 23.
Figure 25:
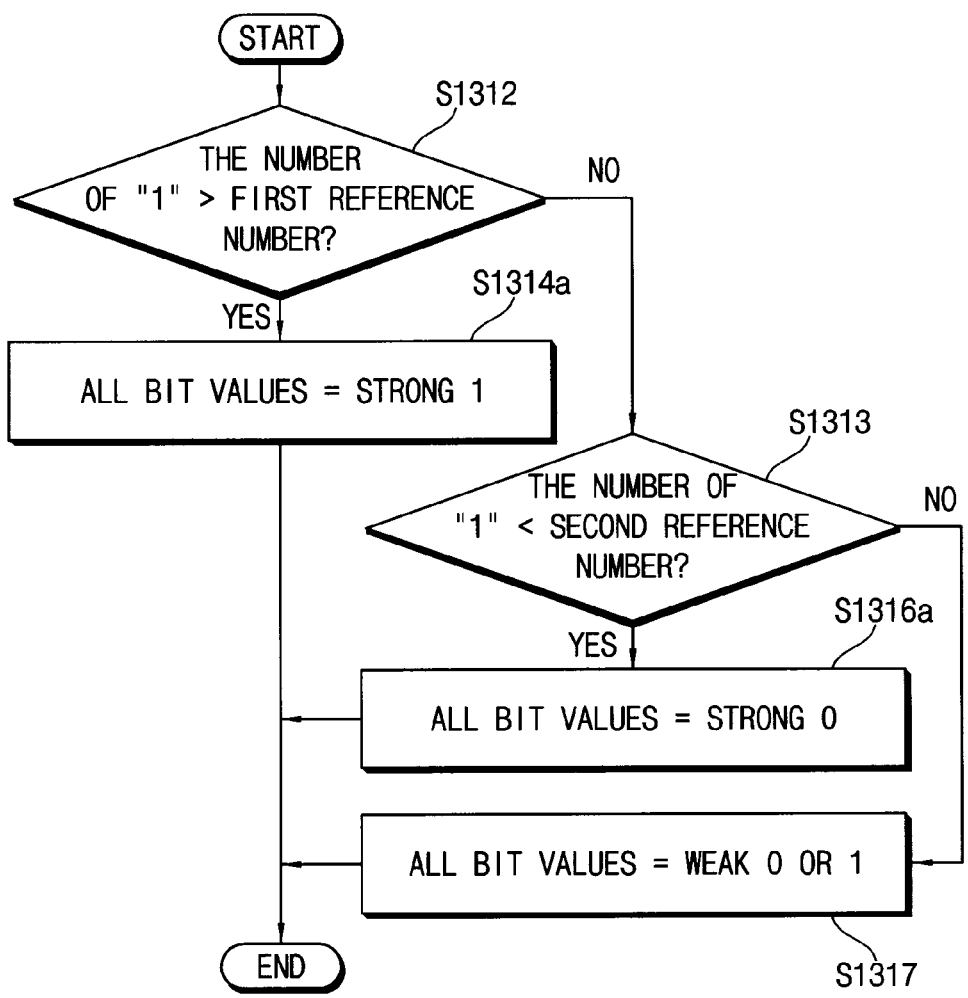
Figure 26:
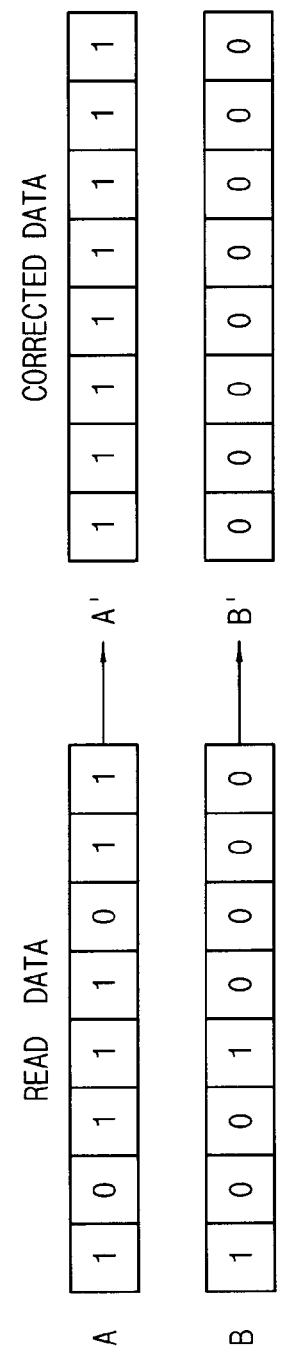
FIG. 26 is a diagram for describing operations of FIGS. 24 and 25.

FIGS. 24 and 25 are flowcharts illustrating examples of step S1310 in FIG. 23. FIG. 26 is a diagram for describing operations of FIGS. 24 and 25.

Referring to FIGS. 23 and 24, when obtaining all of the plurality of first bits included in the first duplicated bit row again (step S1310), when the number of first bits having the value of '1' in the first duplicated bit row is greater than a first reference number (step S1312: YES), all first bits included in the first duplicated bit row may be obtained as '1' (step S1314). When the number of first bits having the value of '1' in the first duplicated bit row is less than or equal to the first reference number (step S1312: NO), all first bits included in the first duplicated bit row may be obtained as '0' (step S1316).

In the example of FIG. 24, when the first duplicated bit row includes eight first bits, the first reference number may be four. When the number of first bits having '1' is 5, 6, 7 or 8, all of the eight first bits may be recovered or restored to '1.' When the number of first bits having '1' is 0, 1, 2, 3 or 4, all of the eight first bits may be recovered or restored to '0.'

Referring to FIGS. 23 and 25, when obtaining all of the plurality of first bits included in the first duplicated bit row again (step S1310), when the number of first bits having the value of '1' in the first duplicated bit row is greater than a first reference number (step S1312: YES), all first bits included in the first duplicated bit row may be obtained as 'STRONG 1' (step S1314a). When the number of first bits having the value of '1' in the first duplicated bit row is less than or equal to the first reference number (step S1312: NO) and less than a second reference number (step S1313: YES), all first bits included in the first duplicated bit row may be obtained as 'STRONG 0' (step S1316a). When the number of first bits having the value of '1' in the first duplicated bit row is less than or equal to the first reference number (step S1312: NO) and greater than or equal to the second reference number (step S1313: NO), all first bits included in the first duplicated bit row may be obtained as 'WEAK 0' or 'WEAK 1' (step S1317).

In the example of FIG. 25, when the first duplicated bit row includes eight first bits, the first reference number may be five and the second reference number may be four. When the number of first bits having '1' is 6, 7 or 8, all of the eight first bits may be recovered to 'STRONG 1.' When the number of first bits having '1' is 0, 1, 2 or 3, all of the eight first bits may be recovered to 'STRONG 0.' When the number of first bits having '1' is 4 or 5, all of the eight first bits may be recovered to 'WEAK 0' or 'WEAK 1.' As described with reference to FIG. 18, the additional error correction may be required in cases of 'WEAK 0' and 'WEAK 1.'

Although only step S1310 in FIG. 23 is described with reference to FIGS. 24 and 25, step S1320 in FIG. 23 may be substantially the same as that described with reference to FIGS. 24 and 25.

Referring to FIG. 26, although errors in which second and sixth bits are changed from '1' to '0' have occurred in data A (e.g., duplicated bit row), the data A may be recovered to data A' in which the second and sixth bits are corrected by the above-described majority voting. Similarly, data B may also be recovered to data B'.

Figure 27:
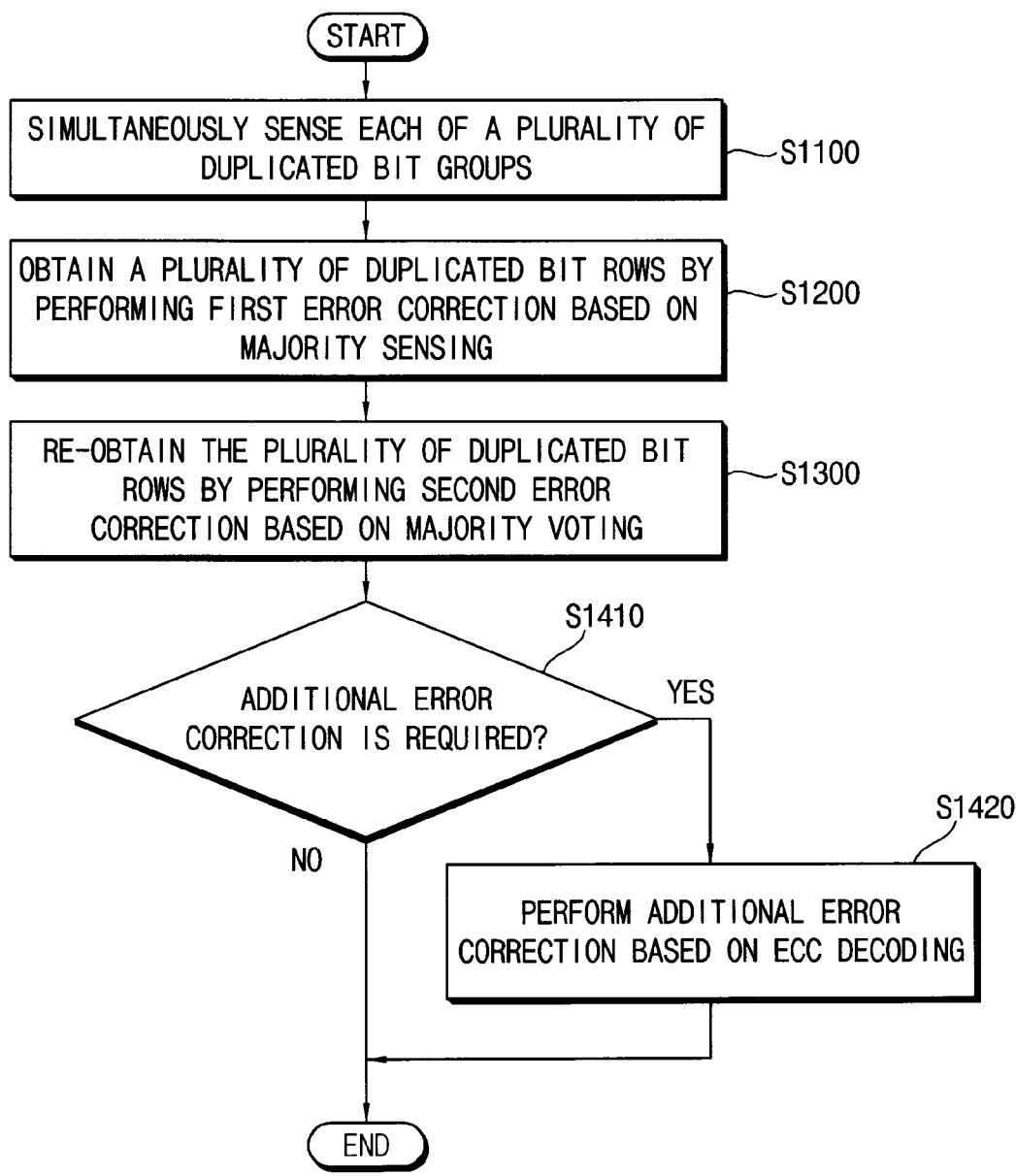
FIGS. 27, 28 and 29 are flowcharts illustrating a method of reading data from a memory device according to example embodiments.
Figure 28:
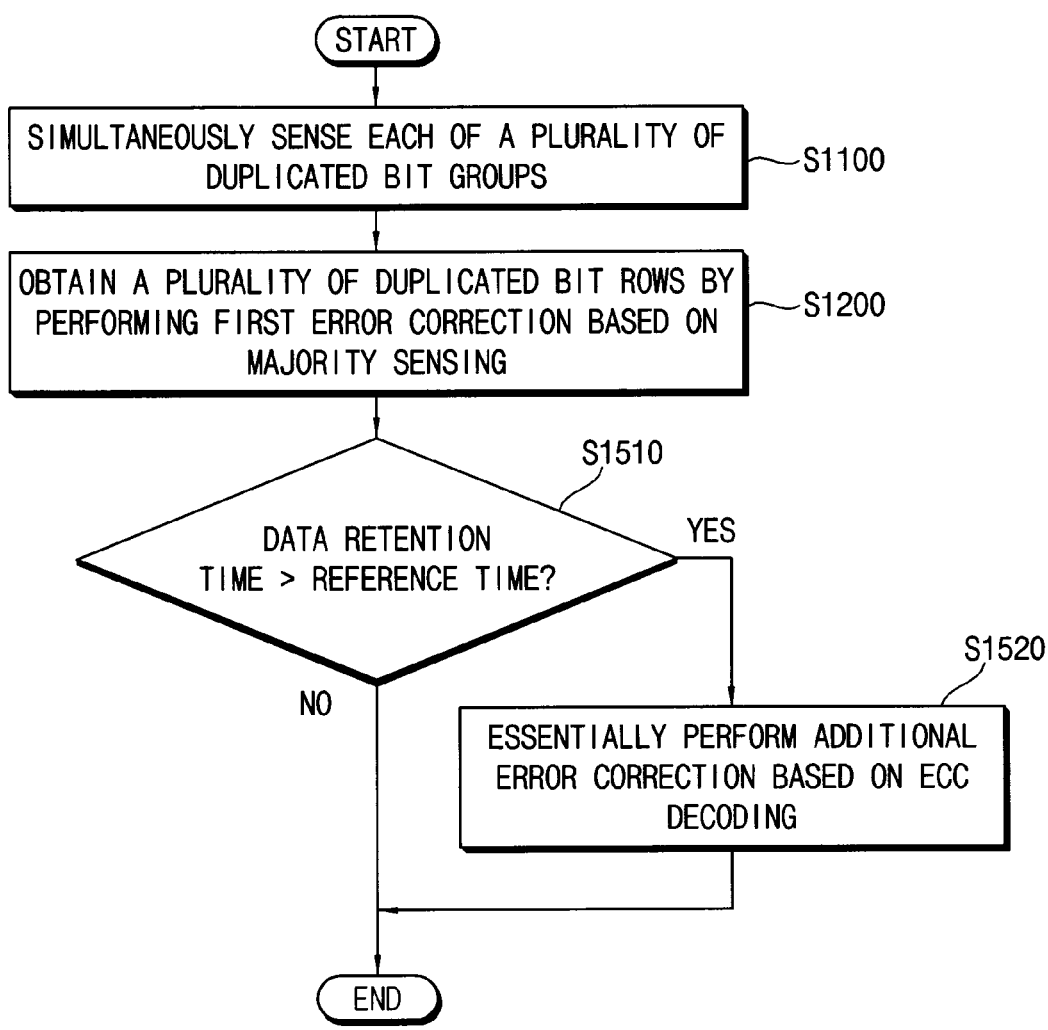
Figure 29:
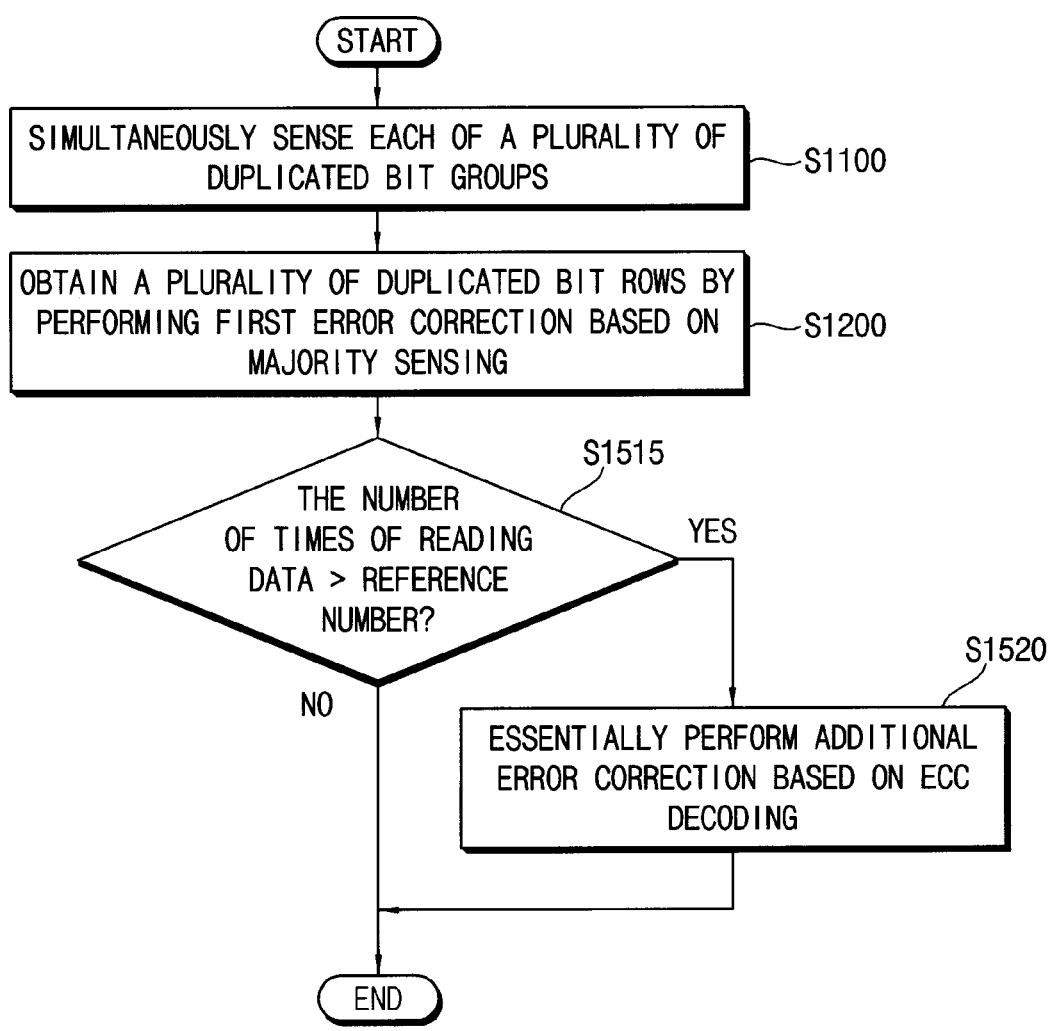

FIGS. 27, 28 and 29 are flowcharts illustrating a method of reading data from a memory device according to example embodiments. The descriptions repeated with FIGS. 13, 20, 21 and 22 will be omitted.

Referring to FIG. 27, the example of FIG. 27 may be substantially the same as the example of FIG. 22, except that steps S1410 and S1420 are added to the example of FIG. 27. Steps S1410 and S1420 in FIG. 27 may be substantially the same as steps S1410 and S1420 in FIG. 20, respectively. In some example embodiments, step S1430 in FIG. 21 may also be added to the example of FIG. 27.

Referring to FIGS. 28 and 29, the examples of FIGS. 28 and 29 may be substantially the same as the example of FIG. 13, except that steps S1510 and S1520 are added to the example of FIG. 28 and steps S1515 and S1520 are added to the example of FIG. 29. In the examples of FIGS. 28 and 29, the additional error correction based on the ECC decoding may be performed when a predetermined condition is satisfied (e.g., when the probability of error occurrence is relatively increased).

In the example of FIG. 28, the predetermined condition may include a data retention time. When the data retention time is greater than a reference time, e.g., when more than the reference time is elapsed from a time point in which the plurality of duplicated bit groups are stored (step S1510: YES), the additional error correction based on the ECC decoding may be performed (step S1520). For example, the data retention time may be detected based on a timestamp.

In the example of FIG. 29, the predetermined condition may include the number of times of reading data. When the number of times of reading data is greater than a reference number, e.g., when the number of times of reading the plurality of duplicated bit groups is greater than the reference number (step S1515: YES), the additional error correction based on the ECC decoding may be performed (step S1520).

In some example embodiments, steps S1510 and S1520 in FIG. 28 and/or steps S1515 and S1520 in FIG. 29 may also be applied to the examples of FIGS. 13, 20, 21, 22 and 27.

Figure 30:
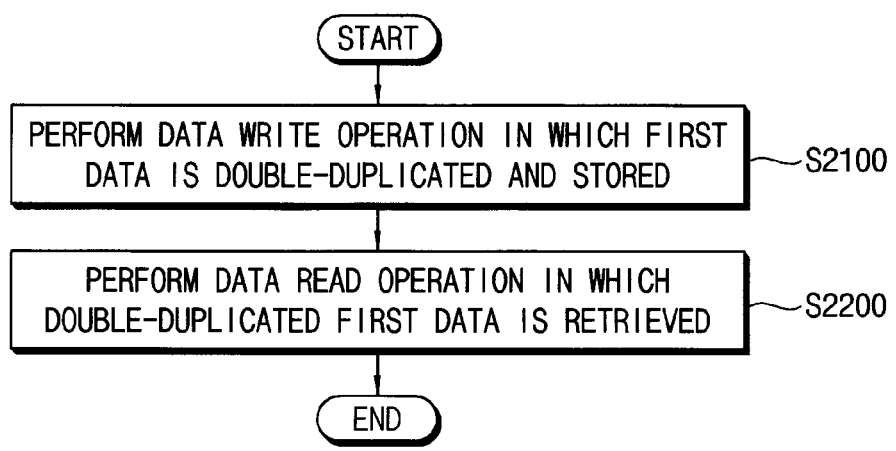
FIG. 30 is a flowchart illustrating a method of operating a memory device according to example embodiments.
Figure 31:
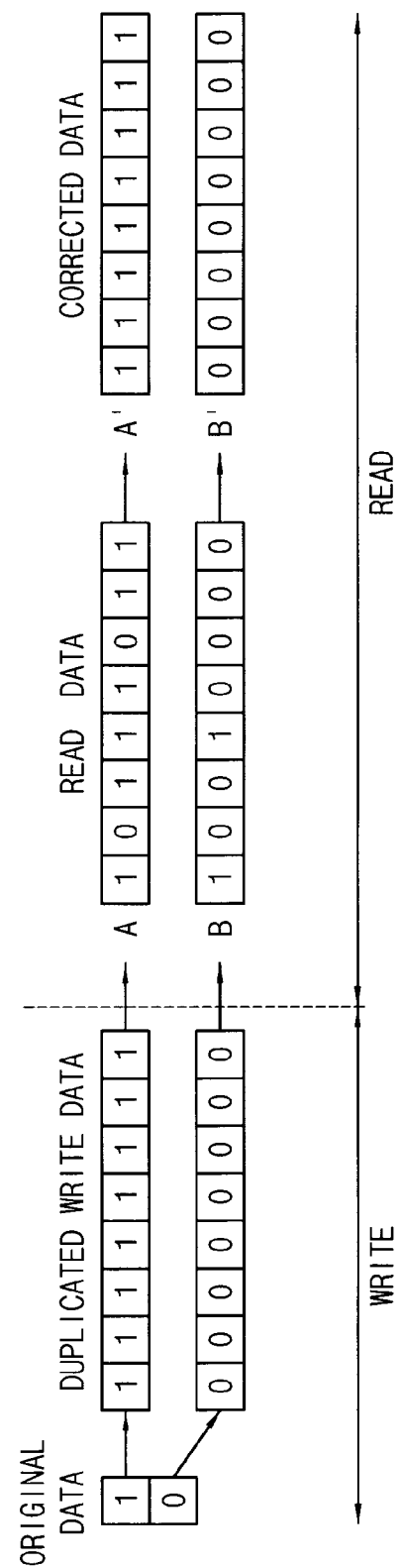
FIG. 31 is a diagram for describing an operation of FIG. 30.

FIG. 30 is a flowchart illustrating a method of operating a memory device according to example embodiments. FIG. 31 is a diagram for describing an operation of FIG. 30.

Referring to FIG. 30, in a method of operating a memory device according to example embodiments, a data write operation in which first data is double-duplicated and the double-duplicated first data is stored is performed (step S2100) and a data read operation in which the double-duplicated first data is retrieved is performed (step S2200). Step S2100 may be performed by the method of writing data described with reference to FIGS. 1 through 12, and step S2200 may be performed by the method of reading data described with reference to FIGS. 13 through 29. Accordingly, data may be processed, treated, or handled as illustrated in FIG. 31.

As will be appreciated by those skilled in the art, the disclosure may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Figure 32:
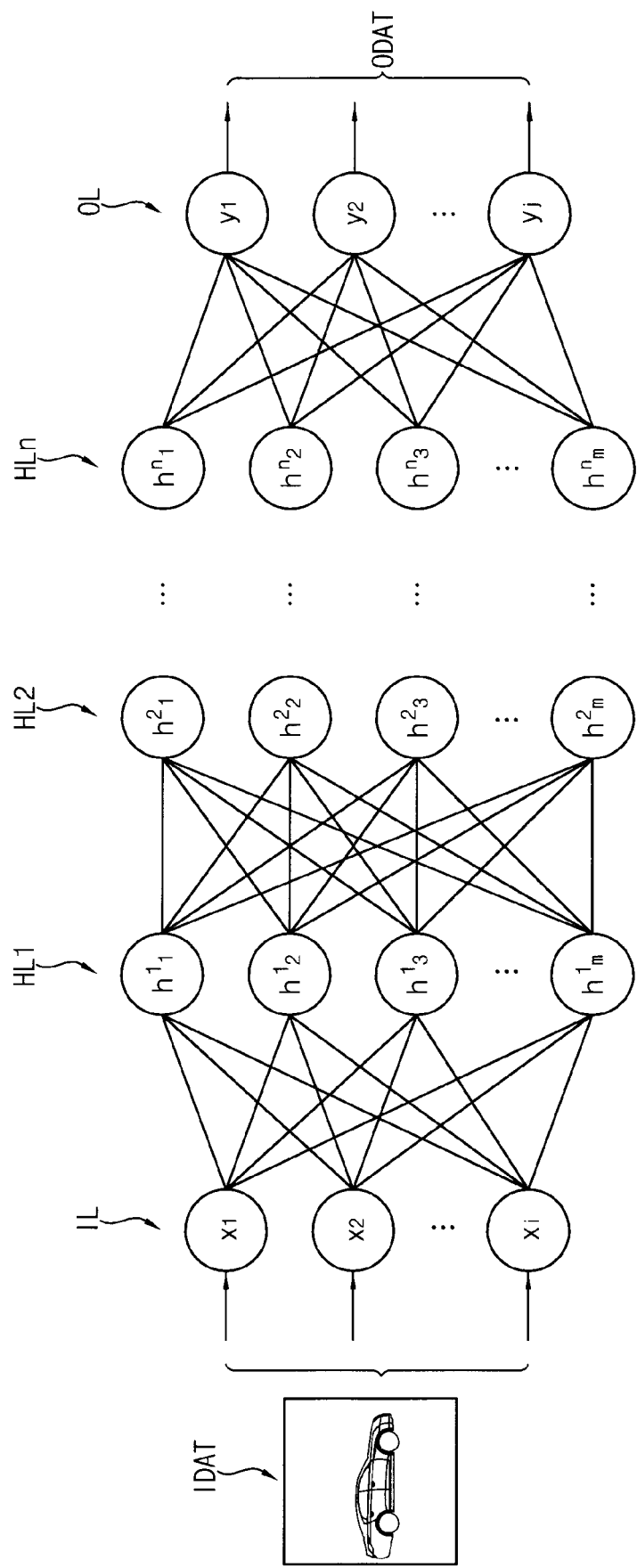
Figure 34:
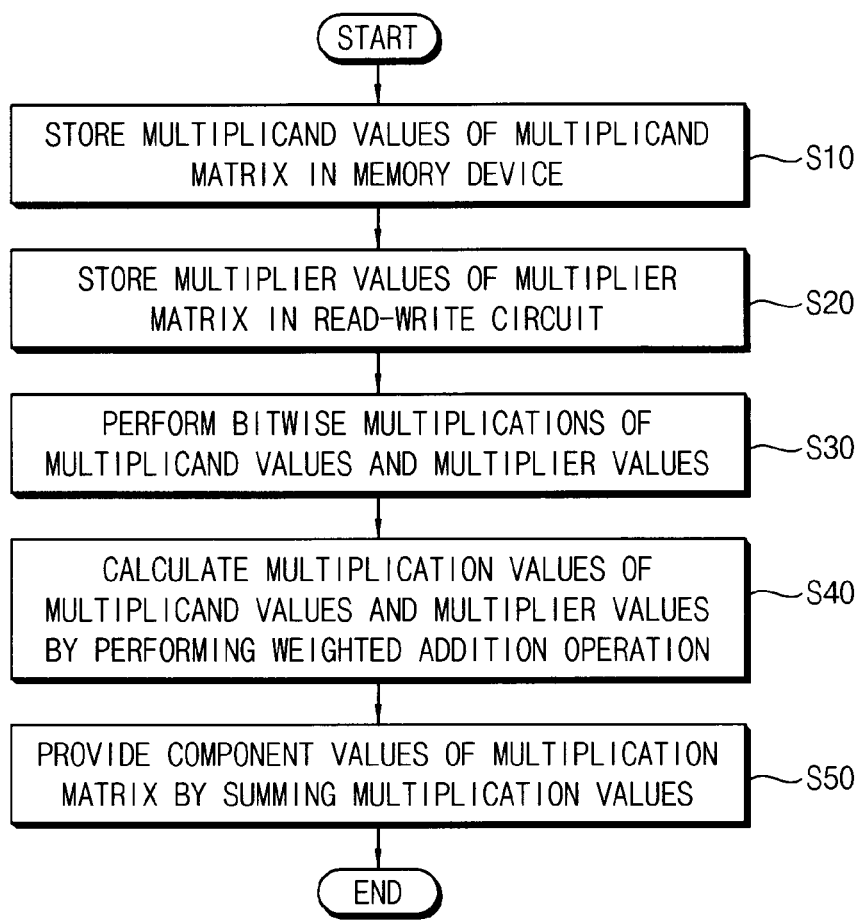

FIGS. 32, 33 and 34 are diagrams for describing a matrix multiplication method using a memory device according to example embodiments.

Referring to FIG. 32, a neural network driven by the memory device according to example embodiments may include an input layer IL, a plurality of hidden layers HL1, HL2, ..., HLn and an output layer OL.

The input layer IL may include i input nodes $x_1$, $x_2$, ..., $x_i$, where i is a natural number. Input data (e.g., vector input data) IDAT whose length is i may be input to the input nodes $x_1, x_2, ..., x_i$ such that each element of the input data IDAT is input to a respective one of the input nodes $x_1$, $x_2, ..., x_i$. The plurality of hidden layers HL1, HL2, ..., HLn may include n hidden layers, where n is a natural number, and may include a plurality of hidden nodes $h^1_1$, $h^1_2$, $h^1_3$, ..., $h^1_m$, $h^2_1$, $h^2_2$, $h^2_3$, ..., $h^2_m$, $h''_1$, $h''_2$, $h''_3$, ..., $h''_m$. The output layer OL may include j output nodes $y_1, y_2, ..., y_j$, where j is a natural number, and may indicate, for example, a probability that the input data IDAT corresponds to a car. A structure of the neural network illustrated in FIG. 32 may be represented by information on branches (or connections) between nodes illustrated as lines, and a weighted value assigned to each branch, which is not illustrated.

Referring to FIG. 33, a multiplication matrix MY may be calculated by multiplying a multiplicand matrix MW and a multiplier matrix MX. Multiplicand values W11 to Wpr of the multiplicand matrix MW, multiplier values X11 to Xrq of the multiplier matrix MX and component values Y11 to Ypq of the multiplication matrix MY may correspond to weight values, input values and output values of a multiplication and accumulation (MAC) operation performed by the neural network described with reference to FIG. 32.

Referring to FIG. 34, the multiplicand values W11 to Wpr of the multiplicand matrix MW may be stored in memory cells of a memory device (step S10). The multiplier values X11 to Xrq of the multiplier matrix MX may be stored in a read-write circuit of the memory device (step S20). Bitwise multiplications of the multiplicand values W11 to Wpr and the multiplier values X11 to Xrq may be performed (step S30). Multiplication values of the multiplicand values W11 to Wpr and the multiplier values X11 to Xrq may be calculated by performing a weighted addition operation (step S40). The component values Y11 to Ypq of the multiplication matrix MY may be provided by summing the multiplication values (step S50). To perform the above-described operations, the read-write circuit 40, the data duplication and arrangement circuit 50 and the operation circuit 60 in FIG. 2 may be used, and the method of writing data, the method of reading data and the method of operating the memory device according to example embodiments may be used. The data processing time and power consumption may be reduced by performing data-intensive processing using the read-write circuit and the operation circuit included in the memory device to reduce the amount of data transferred between the memory device and external devices.

Figure 35:
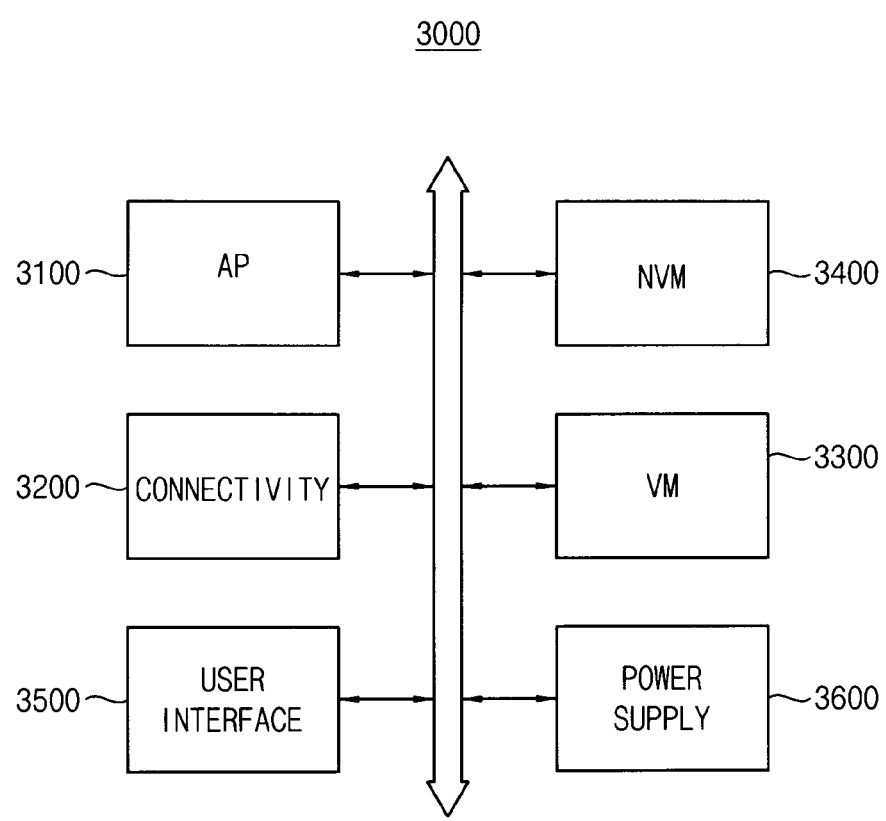
FIG. 35 is a block diagram illustrating a mobile system including a memory device according to example embodiments.

FIG. 35 is a block diagram illustrating a mobile system including a memory device according to example embodiments.

Referring to FIG. 35, a mobile system 3000 includes an application processor (AP) 3100, a connectivity unit 3200, a volatile memory device (VM) 3300, a nonvolatile memory device (NVM) 3400, a user interface 3500 and a power supply 3600 connected via a bus.

The application processor 3100 may execute applications such as a web browser, a game application, a video player, etc. The connectivity unit 3200 may perform wired or wireless communication with an external device. The volatile memory device 3300 and the nonvolatile memory device 3400 may store data processed by the mobile system 3000. The user interface 3500 may include at least one input device and at least one output device. The power supply 3600 may supply a power supply voltage to the mobile system 3000. The volatile memory device 3300 and/or the nonvolatile memory device 3400 may operate based on the method of writing data, the method of reading data and the method of operating the memory device according to example embodiments.

The disclosure may be applied to various electronic devices and/or systems including the memory devices. For example, the disclosure may be applied to systems such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

The foregoing is illustrative of example embodiments and is not to be construed as limiting thereof. Although some example embodiments have been described, those skilled in the art will readily appreciate that many modifications are possible in the example embodiments without materially departing from the novel teachings and advantages of the example embodiments. Accordingly, all such modifications are intended to be included within the scope of the example embodiments as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of writing data in a memory device, the method comprising:
    generating a plurality of duplicated bit rows by performing a first duplication operation in which a plurality of bits included in write data are copied by units of bits;
    generating a plurality of duplicated bit groups by performing a second duplication operation in which the plurality of duplicated bit rows are copied by units of rows; and
    storing the plurality of duplicated bit groups into a plurality of memory regions included in the memory device, respectively, wherein
    each of the plurality of memory regions is a region that is simultaneously sensed during a data read operation.

2. The method of claim 1, wherein:
    the plurality of bits includes first through n-th bits,
    the plurality of duplicated bit rows includes first through n-th duplicated bit rows each of which is generated by copying a respective one of the first through n-th bits m times,
    the plurality of duplicated bit groups includes first through n-th duplicated bit groups each of which is generated by copying a respective one of the first through n-th duplicated bit rows k times,
    the plurality of memory regions includes first through n-th memory regions,
    the first through n-th duplicated bit groups are stored into the first through n-th memory regions, respectively, and
    each of n, m and k is a natural number greater than or equal to two.

3. The method of claim 2, wherein:
the first duplicated bit group that includes k first duplicated bit rows each of which includes m first bits is stored into the first memory region, and
the n-th duplicated bit group that includes k n-th duplicated bit rows each of which includes m n-th bits is stored into the n-th memory region.

4. The method of claim 1, wherein:
the memory device includes a memory cell array that includes a plurality of memory cells connected to a plurality of bitlines and a plurality of wordlines, and
each of the plurality of memory regions is connected to a same bitline.

5. The method of claim 4, wherein:
the memory cell array is divided into a plurality of memory blocks, and
each of the plurality of memory regions includes two or more memory blocks connected to the same bitline among the plurality of memory blocks.

6. The method of claim 4, wherein:
the memory cell array is divided into a plurality of memory blocks,
each of the plurality of memory blocks is divided into a plurality of sub-groups connected to a plurality of string selection lines, and
each of the plurality of memory regions includes two or more sub-groups connected to the same bitline among the plurality of sub-groups included in one memory block.

7. The method of claim 1, further comprising generating error correction code (ECC) bits by performing an ECC encoding on the write data.

8. The method of claim 7, wherein the ECC bits are stored together with the plurality of duplicated bit groups.

9. The method of claim 1, wherein, in a first memory region in which a first duplicated bit group is stored, memory cells corresponding to one row of the first duplicated bit group are connected to a same wordline, and memory cells corresponding to one column of the first duplicated bit group are connected to a same bitline.

10. A method of reading data from a memory device, the method comprising:
when read data including a plurality of bits is written in a scheme such that the plurality of bits are copied by units of bits to generate a plurality of duplicated bit rows, the plurality of duplicated bit rows are copied by units of rows to generate a plurality of duplicated bit groups, and the plurality of duplicated bit groups are stored into a plurality of memory regions included in the memory device, respectively, simultaneously sensing each of the plurality of duplicated bit groups; and
obtaining the plurality of duplicated bit rows by performing a first error correction based on a majority sensing on a sensing result of the plurality of duplicated bit groups.

11. The method of claim 10, wherein:
the plurality of bits includes a first bit,
the plurality of duplicated bit rows includes a first duplicated bit row which is generated by copying the first bit m times, where m is a natural number greater than or equal to two,
the plurality of duplicated bit groups includes a first duplicated bit group which is generated by copying the first duplicated bit row k times, where k is a natural number greater than or equal to two,
the first duplicated bit group is stored in a first memory region included in the plurality of memory regions, and
simultaneously sensing each of the plurality of duplicated bit groups includes simultaneously sensing first bits stored in memory cells connected to a first bitline among a plurality of first bits included in the first duplicated bit group.

12. The method of claim 11, wherein obtaining the plurality of duplicated bit rows includes:
when a first sensing voltage is higher than a first reference voltage, obtaining one bit of the first duplicated bit row as a first value, the first sensing voltage being obtained by simultaneously sensing the memory cells that are connected to the first bitline and store the first bits; and
when the first sensing voltage is lower than or equal to the first reference voltage, obtaining the one bit of the first duplicated bit row as a second value.

13. The method of claim 12, further comprising when the first sensing voltage is between a second reference voltage higher than the first reference voltage and a third reference voltage lower than the first reference voltage, performing an additional error correction on the first duplicated bit row based on an error correction code (ECC) decoding.

14. The method of claim 13, further comprising after the additional error correction is performed on the first duplicated bit row based on the ECC decoding, storing the first duplicated bit row in which the additional error correction is performed into a memory region other than the first memory region.

15. The method of claim 10, further comprising re-obtaining the plurality of duplicated bit rows by performing a second error correction based on a majority voting on the plurality of duplicated bit rows.

16. The method of claim 15, wherein:
the plurality of bits includes a first bit,
the plurality of duplicated bit rows includes a first duplicated bit row which is generated by copying the first bit m times, where m is a natural number greater than or equal to two, and
re-obtaining the plurality of duplicated bit rows includes:
when a number of first bits having a first value among a plurality of first bits included in the first duplicated bit row is greater than a first reference number, obtaining all bits of the first duplicated bit row as the first value; and
when the number of first bits having the first value among the plurality of first bits included in the first duplicated bit row is less than or equal to the first reference number, obtaining all bits of the first duplicated bit row as a second value.

17. The method of claim 16, wherein:
re-obtaining the plurality of duplicated bit rows further includes when the number of first bits having the first value among the plurality of first bits included in the first duplicated bit row is less than a second reference number, obtaining all bits of the first duplicated bit row as the second value, and
the method further includes when the number of first bits having the first value among the plurality of first bits included in the first duplicated bit row is between the first reference number and the second reference number, performing an additional error correction on the first duplicated bit row based on an ECC decoding.

18. The method of claim 10, further comprising when a predetermined condition is satisfied, performing an additional error correction based on an ECC decoding after the plurality of duplicated bit rows are obtained.

19. The method of claim 18, wherein:
the predetermined condition includes a data retention time, and
when more than a reference time is elapsed from a time point in which the plurality of duplicated bit groups is stored, the additional error correction based on the ECC decoding is performed.

20. The method of claim 18, wherein:
the predetermined condition includes a number of times of reading data, and
when a number of times of reading the plurality of duplicated bit groups is greater than a reference number, the additional error correction based on the ECC decoding is performed.

21. The method of claim 10, wherein, in a first memory region in which a first duplicated bit group is stored, memory cells corresponding to one row of the first duplicated bit group are connected to a same wordline, and memory cells corresponding to one column of the first duplicated bit group are connected to a same bitline.

22. A method of operating a memory device, the method comprising:
performing a data write operation in which first data is double-duplicated and double-duplicated first data is stored; and
performing a data read operation in which the double-duplicated first data is retrieved, wherein:
performing the data write operation includes:
generating a first duplicated bit row by performing a first duplication operation in which a first bit included in the first data is copied by units of bits;
generating a first duplicated bit group by performing a second duplication operation in which the first duplicated bit row is copied by units of rows; and
storing the first duplicated bit group into a first memory region,
the first memory region is connected to a same bitline and is a region that is simultaneously sensed during the data read operation,
performing the data read operation includes:
simultaneously sensing the first duplicated bit group; and
obtaining the first duplicated bit row by performing a first error correction based on a majority sensing on a sensing result of the first duplicated bit group, and
obtaining the first duplicated bit row includes:
when a first sensing voltage is higher than a first reference voltage, obtaining one bit of the first duplicated bit row as a first value, the first sensing voltage being obtained by simultaneously sensing memory cells that are connected to a first bitline and store the first bit among memory cells included in the first memory region; and
when the first sensing voltage is lower than or equal to the first reference voltage, obtaining the one bit of the first duplicated bit row as a second value.

23. The method of claim 22, wherein, in the first memory region, memory cells corresponding to one row of the first duplicated bit group are connected to a same wordline, and memory cells corresponding to one column of the first duplicated bit group are connected to the same bitline.

* * * * *